(12) United States Patent
Takahashi et al.

(10) Patent No.: US 11,120,764 B2
(45) Date of Patent: Sep. 14, 2021

(54) DISPLAY DEVICE AND ELECTRONIC DEVICE

(71) Applicant: Semiconductor Energy Laboratory Co., Ltd., Atsugi (JP)

(72) Inventors: Kei Takahashi, Isehara (JP); Koji Kusunoki, Isehara (JP); Susumu Kawashima, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/771,052

(22) PCT Filed: Dec. 4, 2018

(86) PCT No.: PCT/IB2018/059591
§ 371 (c)(1),
(2) Date: Jun. 9, 2020

(87) PCT Pub. No.: WO2019/123064
PCT Pub. Date: Jun. 27, 2019

(65) Prior Publication Data
US 2020/0302889 A1    Sep. 24, 2020

(30) Foreign Application Priority Data

Dec. 21, 2017  (JP) .............................. JP2017-245276
Feb. 23, 2018  (JP) .............................. JP2018-030646

(51) Int. Cl.
*G09G 3/36* (2006.01)
*G09G 3/3225* (2016.01)
(Continued)

(52) U.S. Cl.
CPC ......... *G09G 3/3688* (2013.01); *G09G 3/3225* (2013.01); *G09G 3/3275* (2013.01); *G09G 5/393* (2013.01); *G09G 2320/0276* (2013.01)

(58) Field of Classification Search
CPC ... G09G 3/30-3291; G09G 3/36-3696; G09G 2300/043; G09G 2320/0242-048
See application file for complete search history.

(56) References Cited

U.S. PATENT DOCUMENTS

| | | | |
|---|---|---|---|
| 5,883,608 | A | 3/1999 | Hashimoto |
| 7,012,586 | B2 | 3/2006 | Kageyama et al. |

(Continued)

FOREIGN PATENT DOCUMENTS

| | | |
|---|---|---|
| CN | 001612192 A | 5/2005 |
| CN | 103295523 A | 9/2013 |

(Continued)

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

(Continued)

*Primary Examiner* — Roy P Rabindranath
(74) *Attorney, Agent, or Firm* — Eric J. Robinson; Robinson Intellectual Property Law Office, P.C.

(57) ABSTRACT

A display device with a low power consumption a small circuit area is provided. The display device includes an image signal line, an image data storage portion, a correction data storage portion, and a display element; the correction data storage portion is electrically connected to the image signal line, the image signal line is electrically connected to the image data storage portion, and the image data storage portion is electrically connected to the display element. The (Continued)

image signal line stores a first image data with parasitic capacitance, and the image data storage portion stores the first image data. The correction data storage portion stores a correction data, and then generates a second image data having more gradation levels using the correction data in the correction data storage portion after storing the first image data in the image data storage portion.

7 Claims, 17 Drawing Sheets

(51) Int. Cl.
*G09G 3/3275* (2016.01)
*G09G 5/393* (2006.01)

(56) References Cited

U.S. PATENT DOCUMENTS

| | | | |
|---|---|---|---|
| 8,462,145 | B2 | 6/2013 | Kim et al. |
| 9,384,697 | B2 | 7/2016 | Fujita et al. |
| 10,186,204 | B2 | 1/2019 | Fujita et al. |
| 2005/0088103 | A1 | 4/2005 | Kageyama et al. |
| 2013/0215158 | A1 | 8/2013 | Fujita et al. |
| 2014/0368556 | A1* | 12/2014 | Funatsu .............. G09G 3/3241 345/690 |
| 2020/0175905 | A1 | 6/2020 | Yamazaki et al. |
| 2020/0193928 | A1 | 6/2020 | Kawashima et al. |
| 2020/0194527 | A1 | 6/2020 | Kawashima et al. |
| 2020/0258921 | A1 | 8/2020 | Takahashi et al. |
| 2020/0320930 | A1 | 10/2020 | Toyotaka et al. |

FOREIGN PATENT DOCUMENTS

| | | |
|---|---|---|
| JP | 08-234706 A | 9/1996 |
| JP | 2004-361841 A | 12/2004 |
| JP | 2005-134435 A | 5/2005 |
| JP | 2010-156963 A | 7/2010 |
| JP | 2013-171234 A | 9/2013 |
| KR | 2005-0040679 A | 5/2005 |
| KR | 2013-0096669 A | 8/2013 |
| TW | 200515333 | 5/2005 |
| TW | 201335914 | 9/2013 |
| WO | WO-2019/111104 | 6/2019 |

OTHER PUBLICATIONS

Yamazaki.S et al., "In—Ga—Zn-Oxide Semiconductor and Its Transistor Characteristics", ECS Journal of Solid State Science and Technology, Jul. 1, 2014, vol. 3, No. 9, pp. 03012-03022.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

International Search Report (Application No. PCT/IB2018/059591) dated Mar. 19, 2019.

Written Opinion (Application No. PCT/IB2018/059591) dated Mar. 19, 2019.

* cited by examiner

FIG. 4A1
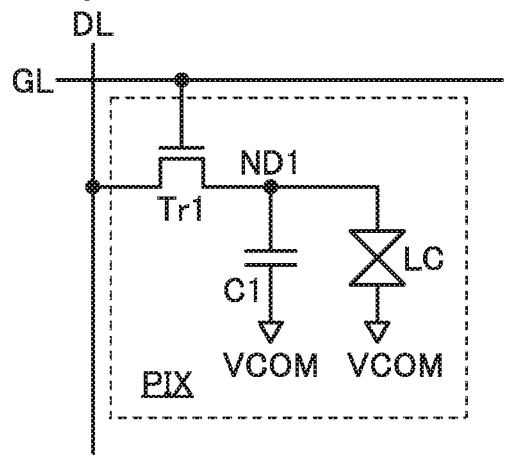
FIG. 4A2
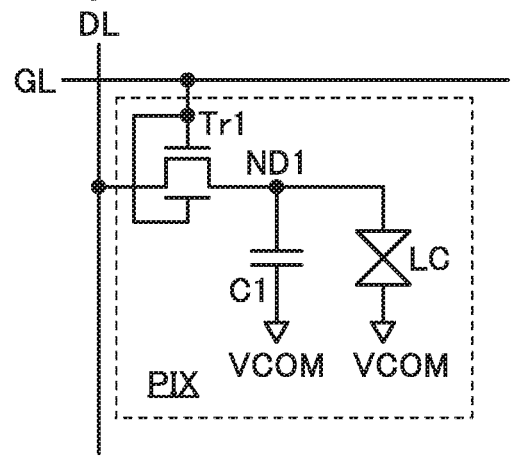
FIG. 4B1
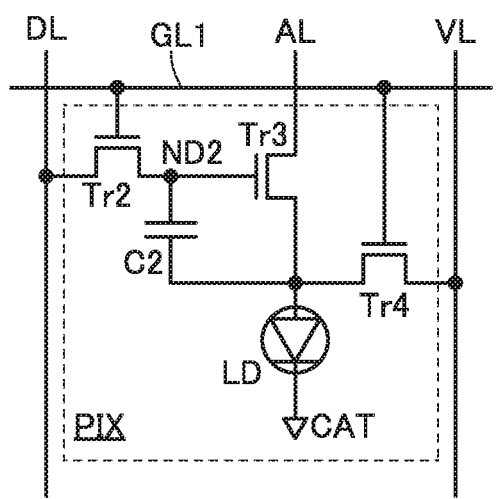
FIG. 4B2
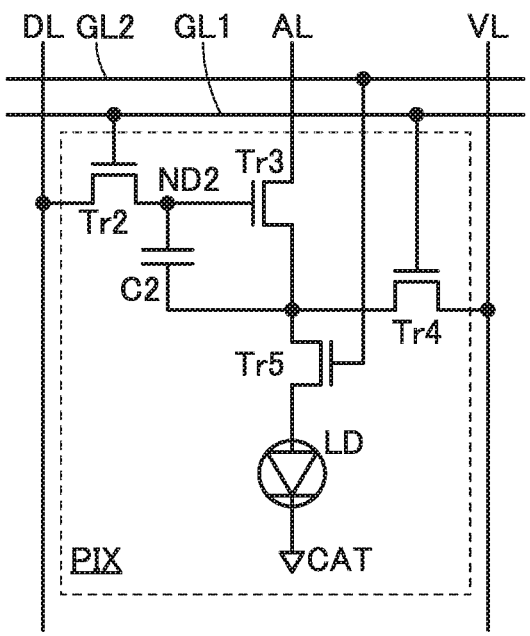

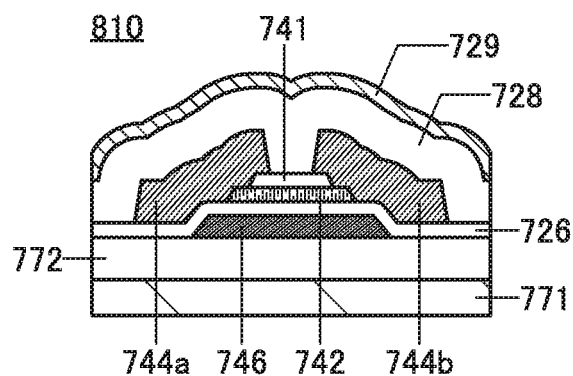
FIG. 11A1
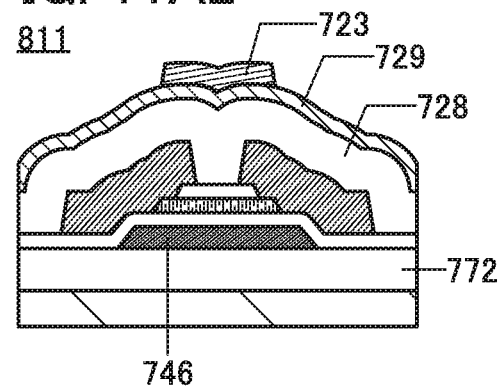
FIG. 11A2
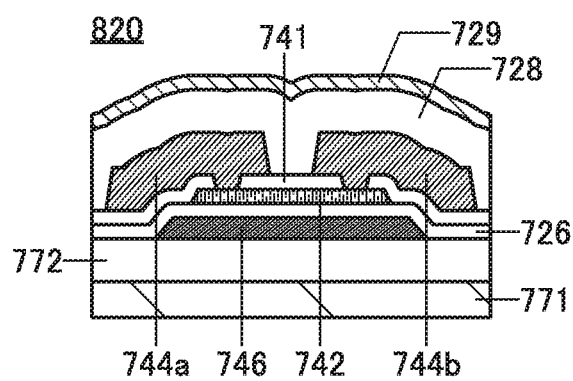
FIG. 11B1
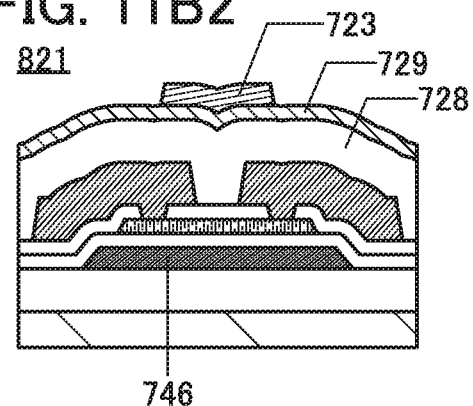
FIG. 11B2
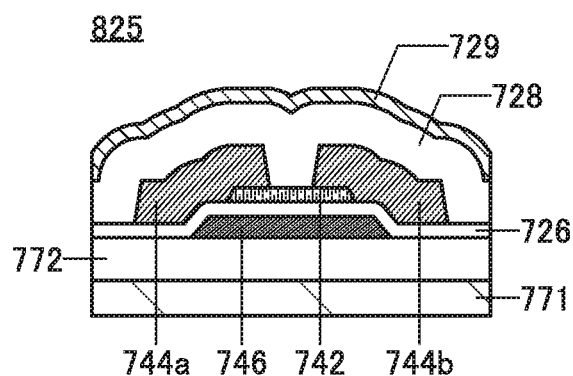
FIG. 11C1
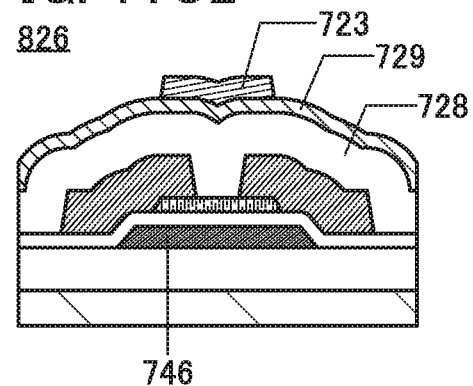
FIG. 11C2

FIG. 12A1
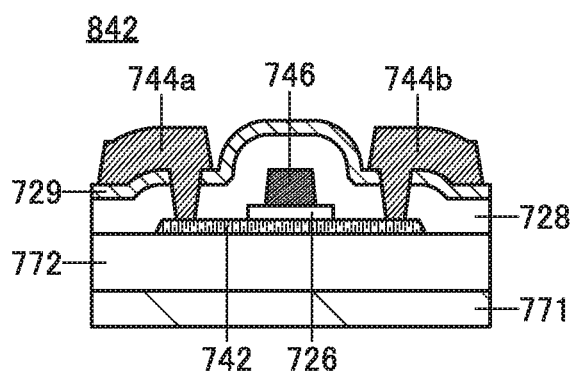
FIG. 12A2
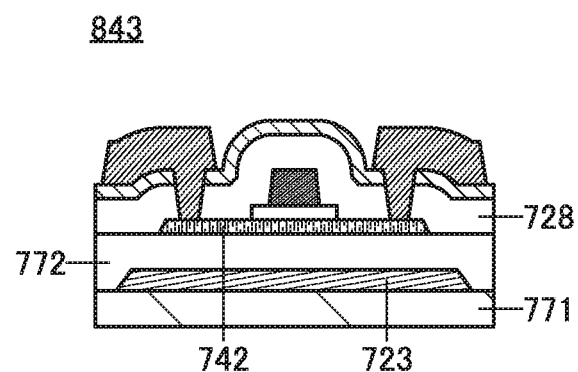
FIG. 12A3
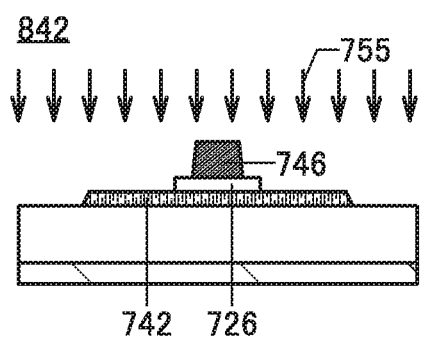
FIG. 12B1
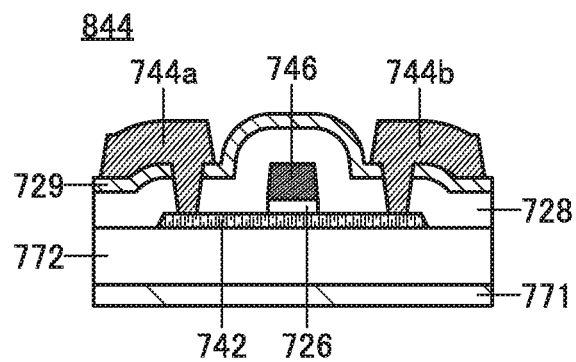
FIG. 12B2
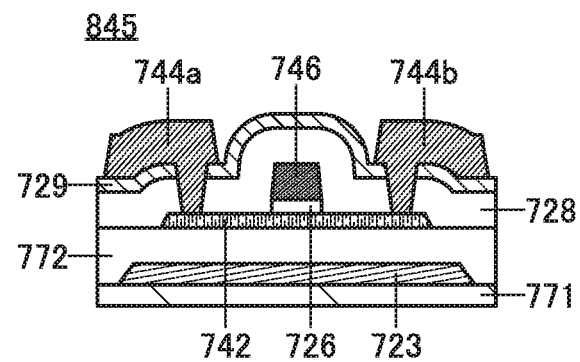
FIG. 12C1
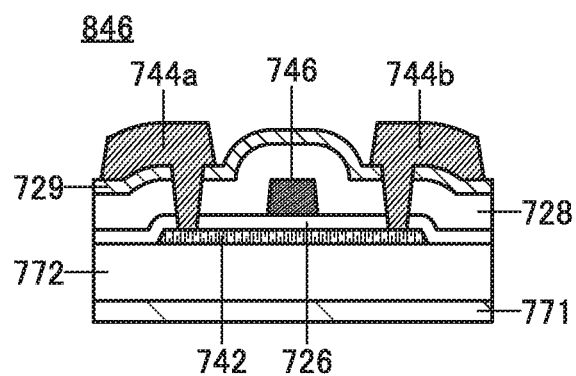
FIG. 12C2
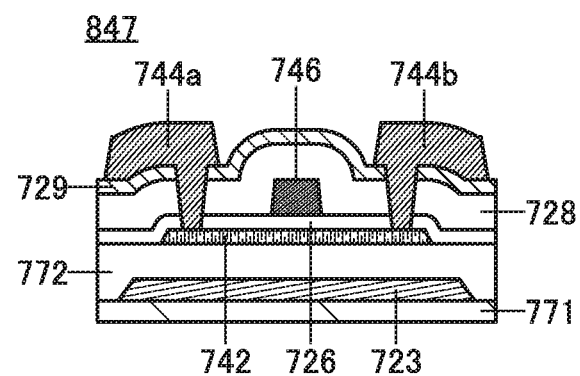

DISPLAY DEVICE AND ELECTRONIC DEVICE

TECHNICAL FIELD

One embodiment of the present invention relates to a display device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition (composition of matter). Therefore, specific examples of the technical field of one embodiment of the present invention disclosed in this specification include a semiconductor device, a display device, a liquid crystal display device, a light-emitting device, a power storage device, an imaging device, a memory device, a processor, an electronic device, a system, a driving method thereof, a manufacturing method thereof, and a testing method thereof.

Background Art

In recent years, various aspects of display devices, in tablet information terminals, notebook PCs (personal computers), portable game consoles, mobile phones such as smartphones, and the like, are being improved. For example, development of display devices, such as increasing the resolution, increasing the color reproducibility, making the driver circuit smaller, and reducing the power consumption, are being undertaken. In addition, for example, an invention of a source driver IC of a display device that includes a liquid crystal element and uses a linear digital-analog converter circuit with many gradations to display an image with many gradations is disclosed in Patent Document 1.

In addition, a technique of using a transistor including an oxide semiconductor in a semiconductor thin film, as a switching element included in a pixel circuit of a display device is given.

A silicon-based semiconductor material is widely known as a semiconductor thin film that can be used in a transistor, and as another material, an oxide semiconductor is attracting attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are neither single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor using IGZO for an active layer has an extremely low off-state current (see Non-Patent Document 6), and an LSI and a display device utilizing the characteristics have been reported (see Non-Patent Document 7 and Non-Patent Document 8). In addition, an invention in which a transistor including IGZO in an active layer is used in a pixel circuit of a display device is disclosed in Patent Document 2.

REFERENCE

Patent Document

[Patent Document 1] U.S. Pat. No. 8,462,145
[Patent Document 2] Japanese Published Patent Application No. 2010-156963

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

As a condition for a display device to display a high-quality image, the display device is required to be high in resolution, numerous in gradation, and wide in color gamut, for example. For example, in a display device including a light-emitting element such as an organic EL (Electro Luminescence) element or a liquid crystal element such as a transmissive liquid crystal element or a reflective liquid crystal element, a source driver circuit needs to be suitably designed to realize an image with many gradations.

To handle image data with many gradations, the resolving power of a digital-analog converter circuit included in a source driver circuit needs to be high; the digital-analog converter circuit, having a high resolving power, can output an analog value (voltage) in finer steps. In the case where a digital-analog converter circuit having a high resolving power is designed, however, the area of the digital-analog converter circuit increases.

An object of one embodiment of the present invention is to provide a display device capable of generating image data with many gradations. In addition, one object of one embodiment of the present invention is to provide a novel display device. In addition, one object of one embodiment of the present invention is to provide a novel electronic device including the display device.

In addition, one object of one embodiment of the present invention is to provide a display device including a source driver circuit with a small circuit area. In addition, one object of one embodiment of the present invention is to provide a display device including a source driver circuit having low power consumption.

Note that the objects of one embodiment of the present invention are not limited to the objects listed above. The objects listed above do not preclude the existence of other objects. The other objects are objects that are not described in this section and will be described below. The objects that are not described in this section will be derived from the description of the specification, the drawings, and the like and can be extracted from the description by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a display device including a first circuit, a second circuit, and an image signal line, in which the first circuit includes an image data storage portion and a display element; the second circuit includes a correction data storage portion; the second circuit is electrically connected to the image signal line; the image signal line is electrically connected to the first circuit; the image data storage portion is electrically connected to the display element; the first circuit has a function of storing a first image data in the image data storage portion; the second circuit has a function of storing a correction data in the correction data storage portion and a function of correcting the first image data stored in the image signal line and the image data storage portion according to the correction data to become a second image data; and the display element has a function of displaying an image corresponding to the second image data.

(2)

Another embodiment of the present invention is the display device with the above structure (1), in which the second circuit includes first to third switches and a first capacitor, the first circuit includes a fourth switch and a second capacitor, a first terminal of the first switch is electrically connected to a first terminal of the first capacitor and the image signal line, a second terminal of the first switch is electrically connected to a first terminal of the second switch, the correction data storage portion is electrically connected to a second terminal of the second switch, a second terminal of the first capacitor, and a first terminal of the third switch, a first terminal of the fourth switch is electrically connected to the image signal line, and the image data storage portion is electrically connected to a second terminal of the fourth switch and the second capacitor.

(3)

Another embodiment of the present invention is the display device with the above structure (2), in which at least one of the first to the fourth switches is a transistor, and the transistor includes one of a metal oxide or silicon in a channel formation region.

(4)

Another embodiment of the present invention is the display device with the above structure (2) or (3) including first to fourth functions, in which the first function includes a function of bringing the second switch into an off state, bringing the third switch into an on state, and writing a first potential into the correction data storage portion, and a function of bringing the second switch into an off state, bringing each of the first switch and the fourth switch into an on state, and writing a second potential corresponding to the first image data to the image signal line and the image data storage portion; the second function includes a function of bringing the first switch into an off state, bringing the fourth switch into an on state, and bringing the image signal line and the image data storage portion into an electrically floating state; the third function includes a function of bringing the first switch and the third switch into an off state, bringing the second switch into an on state, and writing a third potential corresponding to the correction data to the correction data storage portion, and a function where through a change of a potential at the second terminal of the first capacitor from the first potential to the third potential, the second potential stored in the image signal line and the image data storage portion is changed to a fourth potential corresponding to the second image data, and the fourth function includes a function of bringing the fourth switch into an off state and driving the display element in accordance with the fourth potential.

(5)

Another embodiment of the present invention is the display device with the above structure (4), in which the second potential is a potential corresponding to high-order bits in the second image data, and the third potential is a potential corresponding to low-order bits in the second image data.

(6)

Another embodiment of the present invention is the display device with any one of the above structures (2) to (5), in which the display element is a liquid crystal element, and a first terminal of the liquid crystal element is electrically connected to the image data storage portion.

(7)

Another embodiment of the present invention is the display device with any one of the above structures (2) to (5) including a driver circuit portion, in which the display element is a light-emitting element, the driver circuit portion includes a driving transistor, a gate of the driving transistor is electrically connected to the image data storage portion, and a first terminal of the driving transistor is electrically connected to a second terminal of the second capacitor and an input terminal of the light-emitting device.

(8)

Another embodiment of the present invention is an electronic device including the display device with any one of the above structures (1) to (7) and a housing.

Effect of the Invention

With one embodiment of the present invention, a display device capable of generating image data with many gradations can be provided. In addition, with one embodiment of the present invention, a novel display device can be provided. In addition, with one embodiment of the present invention, an electronic device including the display device can be provided.

In addition, with one embodiment of the present invention, a display device including a source driver circuit with a small circuit area can be provided. In addition, with one embodiment of the present invention, a display device including a source driver circuit having low power consumption can be provided.

Note that the effects of one embodiment of the present invention are not limited to the effects listed above. The effects listed above do not preclude the existence of other effects. The other effects are effects that are not described in this section and will be described below. The other effects that are not described in this section will be derived from the description of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIGS. 4A1-4B2 Circuit diagrams illustrating examples of a pixel.

FIGS. 11A1-11C2 Cross-sectional views illustrating structure examples of transistors.

FIGS. 12A1-12C2 Cross-sectional views illustrating structure examples of transistors.

MODE FOR CARRYING OUT THE INVENTION

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. More-over, when an OS FET (or an OS transistor) is described, it can also be referred to as a transistor including a metal oxide or an oxide semiconductor.

Furthermore, in this specification and the like, a metal oxide containing nitrogen is in some cases also collectively referred to as a metal oxide. A metal oxide containing nitrogen may be referred to as a metal oxynitride.

Embodiment 1

Figure 1:
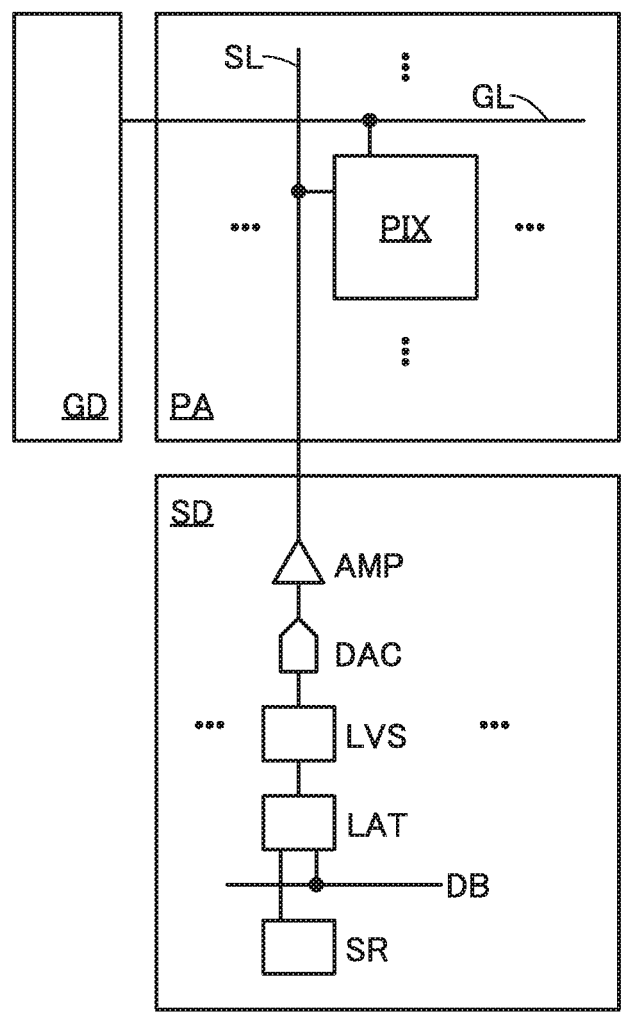
FIG. 1 A block diagram illustrating an example of a display device.

In this embodiment, a display device of one embodiment of the present invention will be described.
<Structure Example 1 of Display Device>
First, a structure example of a display device will be described. FIG. 1 is a block diagram illustrating an example of a display device including a display element. A display device DD includes a display portion PA, a source driver circuit SD, and a gate driver circuit GD.

The display portion PA includes a plurality of pixels PIX. Note that in FIG. 1, only one of the plurality of pixels PIX in the display portion PA is illustrated and the other pixels PIX are omitted. The plurality of pixels PIX in the display portion PA are preferably arranged in a matrix.

In FIG. 1, the pixel PIX is electrically connected to the source driver circuit SD through a wiring SL that functions as an image signal line. In addition, the pixel PIX is electrically connected to the gate driver circuit GD through a wiring GL that functions as a selection signal line. Note that since the display portion PA includes a plurality of pixels PIX, a plurality of pixels PIX may be electrically connected to the wiring SL. Similarly, a plurality of pixels PIX may be electrically connected to the wiring GL. Furthermore, a plurality of each of the wirings SL and the wirings GL may be provided in accordance with the number of the pixels PIX included in the display portion PA. Furthermore, depending on the circuit structure of the pixel PIX, a structure in which a plurality of the wirings SL or a plurality of the wirings GL are electrically connected to one pixel PIX may be employed.

The pixel PIX can have a structure that includes one or more subpixels. For example, a structure with one subpixel (any one color of red (R), green (G), blue (B), white (W), or the like), a structure with three subpixels (three colors of red (R), green (G), and blue (B), or the like), or a structure with four subpixels (four colors of red (R), green (G), blue (B), and white (W), four colors of red (R), green (G), blue (B), and yellow (Y), or the like) may be applied to the pixel PIX. Note that color elements applied to the subpixels are not limited to the above combinations, and cyan (C), magenta (M) and the like may be combined as necessary.

The source driver circuit SD has a function of generating image data to be input to the pixel PIX included in the display portion PA and a function of transmitting the image data to the pixel PIX.

The source driver circuit SD can include, for example, a shift register SR, a latch circuit LAT, a level shift circuit LVS, a digital-analog converter circuit DAC, an amplifier circuit AMP, and a data bus wiring DB. In FIG. 1, an output terminal of the shift register SR is electrically connected to a clock input terminal of the latch circuit LAT; an input terminal of the latch circuit LAT is electrically connected to the data bus wiring DB; an output terminal of the latch circuit LAT is electrically connected to an input terminal of the level shift circuit LVS; an output terminal of the level shift circuit LVS is electrically connected to an input terminal of the digital-analog converter circuit DAC; an output terminal of the digital-analog converter circuit DAC is electrically connected to an input terminal of the amplifier circuit AMP; and an output terminal of the amplifier circuit AMP is electrically connected to the display portion PA.

Note that the latch circuit LAT, the level shift circuit LVS, the digital-analog converter circuit DAC, and the amplifier circuit AMP that are illustrated in FIG. 1 are provided for one wiring SL. That is, depending on the number of the wirings SL, a plurality of each of the latch circuits LAT, the level shift circuits LVS, the digital-analog converter circuits DAC, and the amplifier circuits AMP need to be provided. Note that in this case, the shift register SR may have a structure in which pulse signals are sequentially transmitted to a clock input terminal of each of the plurality of latch circuits LAT.

The data bus wiring DB is a wiring for transmitting a digital signal containing image data to be input to the display portion PA. The image data have gradation levels; as gradation levels become more numerous, changes in color or brightness can be expressed more smoothly and a more natural image can be displayed on the display portion PA. However, as gradation levels become more numerous the data volume of the image data increases, and a digital-analog converter circuit with a high resolving power needs to be used.

A digital signal containing image data is input to the input terminal of the latch circuit LAT from the data bus wiring DB. Then, the latch circuit LAT performs either one of the following operations depending on a signal transmitted from the shift register SR: storing the image data, or outputting the stored image data from the output terminal.

The level shift circuit LVS has a function of converting an input signal into an output signal with a higher amplitude voltage or a lower amplitude voltage. In FIG. 1, the level shift circuit LVS has a function of converting the amplitude voltage of a digital signal containing image data that is sent from the latch circuit LAT into an amplitude voltage at which the digital-analog converter circuit DAC operates properly.

The digital-analog converter circuit DAC has a function of converting an input digital signal containing image data into an analog signal and a function of outputting the analog signal from the output terminal. In particular, in the case where image data with many gradations are displayed on the display portion PA, the digital-analog converter circuit DAC needs to be a high-resolving-power digital-analog converter circuit.

The amplifier circuit AMP has a function of amplifying an analog signal input to the input terminal and outputting the signal to the output terminal. By providing the amplifier circuit AMP between the digital-analog converter circuit DAC and the display portion PA, image data can be stably transmitted to the display portion PA. A voltage follower circuit including an operational amplifier and the like can be applied as the amplifier circuit AMP. Note that in the case where a circuit including a differential input circuit is used as the amplifier circuit, the offset voltage of the differential input circuit is preferably a voltage that is as close to 0 V as possible.

Through the above operations, the source driver circuit SD can convert the digital signal containing image data that is transmitted from the data bus wiring DB into an analog signal and transmit the analog signal to the display portion PA.

The gate driver circuit GD has a function of selecting, from the plurality of pixels PIX included in the display portion PA, a pixel PIX to which image data is input.

As a method for inputting image data to the display portion PA, for example, the gate driver circuit GD may transmit a selection signal to the plurality of pixels PIX electrically connected to one wiring GL, bringing image-data-write switching elements included in the plurality of pixels PIX into an on state, then transmit image data from the source driver circuit SD to the plurality of pixels PIX through the wirings SL, thereby writing image data. Therefore, in this specification and the like, the wiring GL can be referred to as a gate line, a selection signal, or the like, and the wiring SL can be referred to as a source line, a data line, an image signal line, or the like.

Note that one embodiment of the present invention is not limited to the structure of the display device DD in FIG. 1. One embodiment of the present invention can be obtained by appropriately changing a component of the display device DD according to conditions such as design specifications and objectives, for example.

In the case where an image with many gradations is to be displayed on the display portion PA, the digital-analog converter circuit DAC needs to have a high resolving power. In that case, the size of the digital-analog converter circuit DAC increases; thus, the circuit area of the source driver circuit SD may increase. When circuit elements such as a transistor and a capacitor that are included in a circuit on the source driver circuit SD are shrunk to reduce the circuit area of the source driver circuit SD, the electrical characteristics of the circuit elements might degrade through an influence of parasitic resistance, an influence of a structural variation caused in fabrication of the circuit elements, or the like.

<Structure Example 2 of Display Device>

A display device of one embodiment of the present invention is structured taking the above into account, and has a structure in which the potential of an image data storage portion of the pixel PIX is changed, through capacitive coupling, to a potential that has a higher precision than a potential that can be output from the digital-analog converter circuit DAC. In other words, the display device of one embodiment of the present invention can supply a potential having a higher resolving power than the digital-analog converter circuit DAC to the image data storage portion of the pixel PIX. Thus, the digital-analog converter circuit with low resolving power can be used, as increases in the resolving power of the digital-analog converter circuit becomes unnecessary. Consequently, the circuit area of the source driver circuit SD including the digital-analog converter circuit DAC can be reduced, and the power consumption of the source driver circuit SD can be reduced.

Figure 2A:
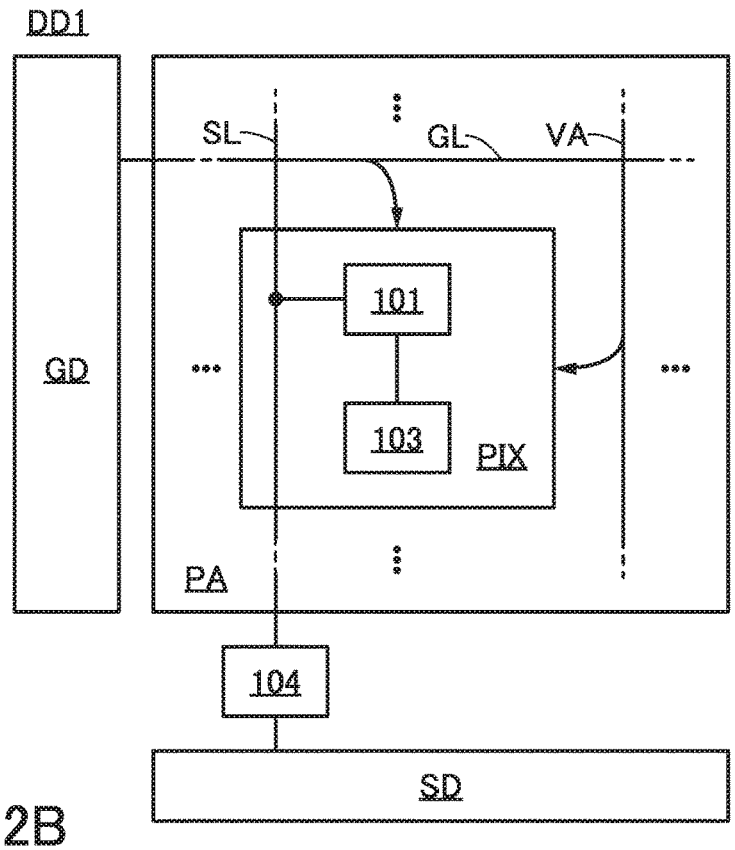
FIGS. 2A-2B A block diagram illustrating an example of a display device.
Figure 2B:
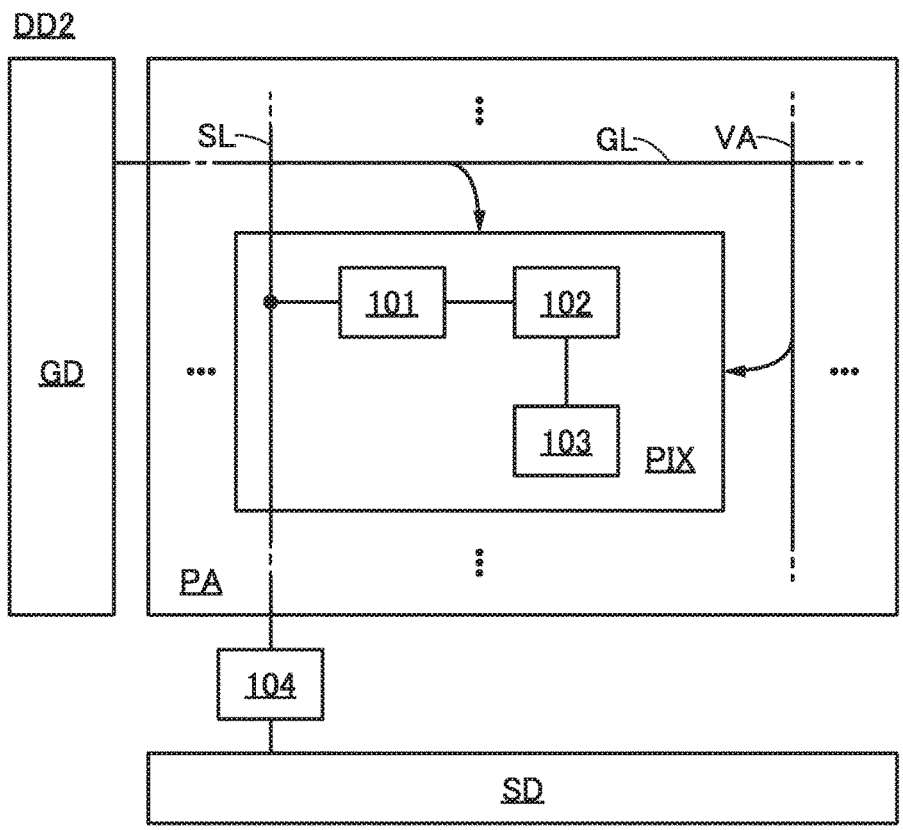

FIGS. 2(A) and 2(B) illustrates a structure example of a display device of one embodiment of the present invention.

A block diagram in FIG. 2(A) illustrates an example of a display device including a liquid crystal element, and the display device DD1 includes a display portion PA and a circuit provided around the display portion PA.

Specifically, the display device DD1 illustrated in FIG. 2(A) includes a correction data storage portion 104 in addition to the display portion PA, the gate driver circuit GD, and the source driver circuit SD illustrated in FIG. 1. The pixel PIX included in the display portion PA includes an image data storage portion 101 and a display element 103.

An input terminal of the correction data storage portion 104 is electrically connected to an output terminal of the source driver circuit SD, and an output terminal of the correction data storage portion 104 is electrically connected to the wiring SL.

The display portion PA illustrated in FIG. 2(A) includes a plurality of pixels PIX in a manner similar to the display portion PA illustrated in FIG. 1. Note that FIG. 2(A) illustrates only one of the plurality of pixels PIX included in the display portion PA, and the other pixels PIX are omitted. In a pixel PIX included in the display portion PA, the image data storage portion 101 is electrically connected to the display element 103. In addition, the image data storage portion 101 is electrically connected to the wiring SL.

The image data storage portion 101 has a function of storing image data transmitted from the source driver circuit SD via the correction data storage portion 104 and the wiring SL. In addition, the image data storage portion 101 can include a write switching element, a capacitor, and the like for holding the image data.

The display element 103 included in the pixel PIX illustrated in FIG. 2(A) has a function of controlling light emitted from the pixels PIX. The intensity of the light (which can be rephrased as a level of the luminance, the gradation level, and the like) is determined depending on the image data stored in the image data storage portion 101.

As the display element 103, a liquid crystal element can be applied as described above. As the liquid crystal element, a transmissive liquid crystal element and a reflective liquid crystal element can be given. Examples other than the liquid crystal element include, for example, a display element using an electrophoretic element, or an Electronic Liquid Powder (registered trademark), a display element with an electrowetting method, or the like can be given. Note that the case where a light-emitting element such as an inorganic EL element or an organic EL element is used as the display element 103 will be described later.

A wiring VA illustrated in FIG. 2(A) is electrically connected to the pixel PIX. The wiring VA can be, for example, a capacitor line for storing image data in the image data storage portion 101, a wiring for supplying a potential to one terminal of the liquid crystal element of the display element 103, and the like. Thus, the wiring VA can be one or a plurality of wirings.

It has been described in the description of the display device DD in FIG. 1 that the wiring GL has a function of transmitting selection signals in advance when image data is written to the pixel PIX; alternatively, the wiring GL may have a function of controlling the on state and the off state between the pixel PIX and the wiring VA in FIG. 2(A). Thus, the wiring GL can be one or a plurality of wirings. Through this, application of a voltage and/or supply of current from the wiring VA can temporarily be stopped.

The block diagram in FIG. 2(B) shows an example of a display device including a light-emitting element such as an organic EL element or an inorganic EL element.

Specifically, the display device DD2 in FIG. 2(B) is different from the display device DD1 in that the pixel PIX included in the display portion PA includes a driver circuit portion 102, though the display device DD2 has substantially the same structure as the pixel PIX in the display device DD1. Therefore, only portions different from the display device DD1 are described for the display device DD2, and description of portions that are the same as those in the display device DD1 is omitted.

The driver circuit portion 102 is electrically connected to the image data storage portion 101 and the display element 103.

The driver circuit portion 102 has a function of driving the display element 103 in accordance with image data stored in the image data storage portion 101. In the case where a light-emitting element such as an organic EL element in which the emission luminance is determined by current is used as the display element 103, the driver circuit portion 102 can include a driving transistor that controls the current, for example. Note that the driving transistor has a function of supplying a drive current to the display element 103.

A light-emitting element can be used as the display element 103 included in the pixel PIX illustrated in FIG. 2(B) as described above, for example. As the light-emitting element, an inorganic EL element, an organic EL element, and the like, can be given. For others, a micro-LED and the like can be given, for example.

The wiring VA in FIG. 2(B) is electrically connected to the pixel PIX in a manner similar to that of the wiring VA illustrated in FIG. 2(A). The wiring VA here can be used as a capacitor line for storing image data in the image data storage portion 101, a voltage-supply line for driving the driver circuit portion 102, a wiring for supplying current to the light-emitting element, or the like. Thus, the wiring VA in FIG. 2(B) can be one or more wirings in a manner similar to the wiring VA in FIG. 2(A).

Figure 3:
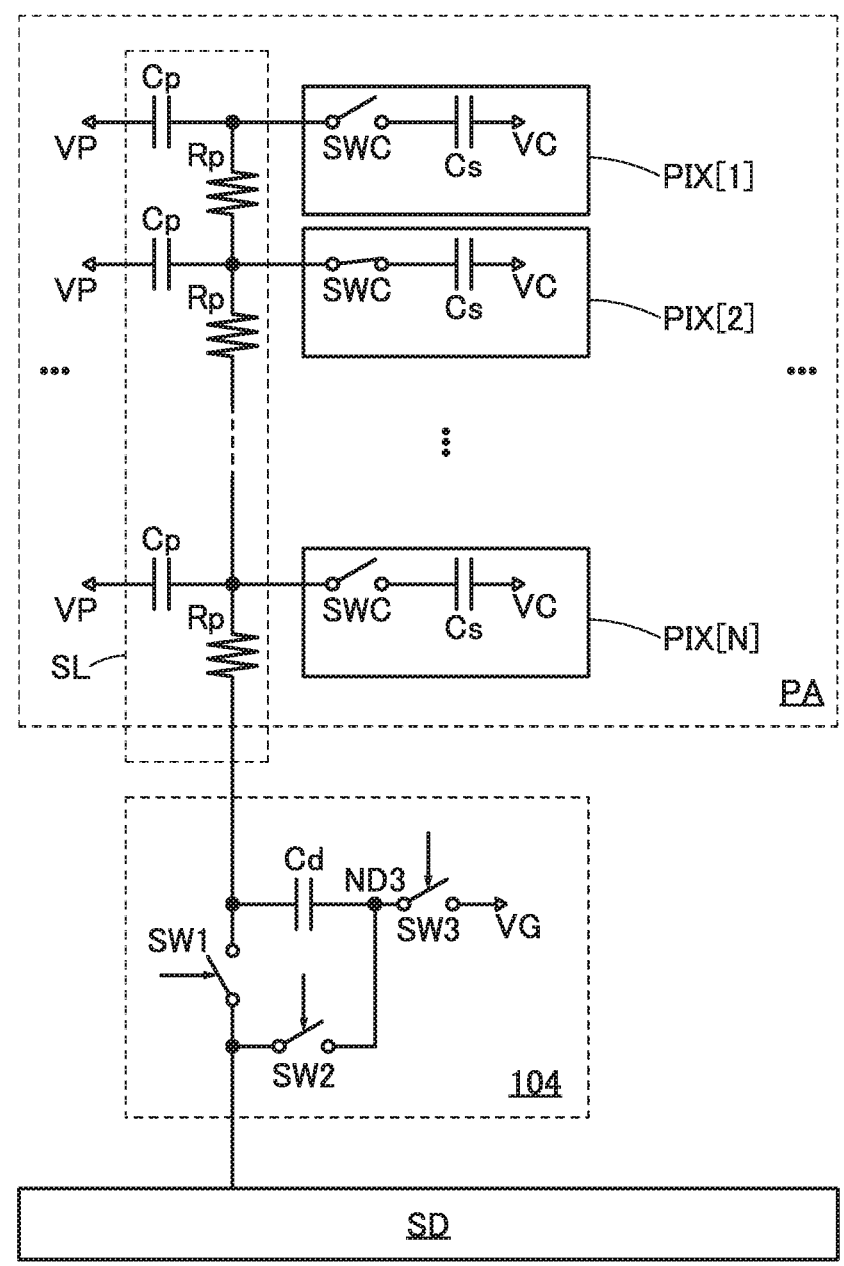
FIG. 3 A circuit diagram illustrating an example of a display device.

Next, the correction data storage portion 104, the wiring SL that functions as an image signal line, and the pixel PIX are described in detail. FIG. 3 is a circuit diagram illustrating the parasitic capacitance and the wire resistance of the wiring SL, a circuit structure example of the pixel PIX, and a circuit structure example of the correction data storage portion 104. Note that in FIG. 3, the source driver circuit SD is illustrated to illustrate its connection relation with the correction data storage portion 104. In addition, in the pixel PIX, the only circuit elements illustrated are a switch SWC and a capacitor Cs, and the illustration of other circuit elements is omitted. In addition, although the wiring SL electrically connected to the pixel PIX is illustrated in FIG. 3, a wiring for transmitting a selection signal to the pixel PIX (a wiring corresponding to the wiring GL in FIG. 1 and FIG. 2) and a wiring for applying a predetermined potential to a particular node (a wiring corresponding to the wiring VA in FIG. 2) are omitted.

As described above, parasitic capacitance and wire resistance included in the wiring SL is illustrated with the wiring SL in FIG. 3. Specifically, the wiring SL includes a resistor Rp as wire resistance and a capacitor Cp as parasitic capacitance for one pixel PIX. The display portion PA illustrated in FIG. 3 includes N pixels PIX in one column (N is an integer greater than or equal to 1), and the wiring SL includes N resistors Rp connected in series, and N capacitors Cp connected in parallel. In addition, FIG. 3 treats one pixel PIX as being electrically connected to a point of electrical connection between the first terminal of the capacitor Cp and the first terminal of the resistor Rp.

In the display portion PA illustrated in FIG. 3, the pixel PIX provided on the i-th row (i is an integer greater than or equal to 1 and less than or equal to N) is illustrated as the pixel PIX[i]. In addition, in some cases in this specification, the description of the address for each of the pixel PIX[1] to the pixel PIX[N] is omitted unless otherwise specified. In addition, in FIG. 3, the pixel PIX[1], the pixel PIX[2], and the pixel PIX[N] are illustrated, and the other pixels PIX are omitted.

The pixel PIX includes the switch SWC and the capacitor Cs. A first terminal of the switch SWC is electrically connected to the first terminal of the capacitor Cs, and a second terminal of the switch SWC is electrically connected to the wiring SL. A second terminal of the capacitor Cs is electrically connected to a wiring VC. Switching of the switch SWC between the on state and the off state is performed with a selection signal from the wiring GL and the like that are transmitted to the pixel PIX, for example.

The capacitor Cs can be a capacitor for storing image data included in the image data storage portion 101 described in FIG. 2. In addition, for example, the wiring VC can be a wiring for supplying an appropriate potential to the second terminal of the capacitor Cs for storing the image data.

A second terminal of the capacitor Cp functioning as a parasitic capacitor is regarded as being electrically connected to a wiring VP. As the wiring VP, for example, the wiring GL for transmitting selection signals to the pixels PIX, the wiring VC, or the like can be used.

The correction data storage portion 104 includes a switch SW1 to a switch SW3 and a capacitor Cd. A first terminal of the switch SW1 is electrically connected to a first terminal of the capacitor Cd and the wiring SL, and a second terminal of the switch SW1 is electrically connected to a first terminal of the switch SW2 and the source driver circuit SD. A first terminal of the switch SW3 is electrically connected to a second terminal of the capacitor Cd and a second terminal of the switch SW2, and a second terminal of the switch SW3 is electrically connected to the wiring VG.

Note that in this embodiment, a point of electrical connection between the second terminal of the switch SW2, the second terminal of the capacitor Cd, and the first terminal of the switch SW3 is referred to as a node ND3.

The correction data storage portion can write correction data to the second terminal (the node ND3) of the capacitor Cd by bringing the switch SW2 into an on state.

The wiring VG is a wiring for resetting correction data which are stored in the correction data storage portion 104, and can be, for example, a wiring which supplies a reference potential.

<Circuit Structure Example of Pixel>

Next, circuit structure examples that are applicable to the pixel PIX illustrated in FIG. 1 to FIG. 3 will be described.

The pixel PIX illustrated in FIG. 4(A1) includes a transistor Tr1, a capacitor C1, and a liquid crystal element LC. Furthermore, a wiring DL, the wiring GL, and a wiring VCOM are electrically connected to the pixel PIX.

A transistor Tr1 functions as a switching element. In particular, the transistor Tr1 functions as a transistor which electrically connects and disconnects the first terminal of the liquid crystal element LC and the wiring DL. That is, the transistor Tr1 can correspond to the switch SWC included in the pixel PIX in FIG. 3. In addition, a structure described in Embodiment 3 can be applied to the transistor Tr1.

The wiring DL is a wiring for transmitting image data to the pixel PIX and is a wiring that corresponds to the wiring SL illustrated in FIG. 1 to FIG. 3. Additionally, the wiring GL is a selection signal line for the pixel PIX and is a wiring that corresponds to the wiring GL illustrated in FIG. 1 and FIG. 2.

The wiring VCOM is a wiring for supplying a predetermined potential to a second terminal of the liquid crystal element LC. The predetermined potential can be, for example, a reference potential, a low-level potential, or a potential lower than these potentials. Furthermore, the wiring VCOM can supply a common potential to the second terminal of the liquid crystal element LC included in each of the plurality of pixels PIX included in the display portion PA.

A first terminal of the transistor Tr1 is electrically connected to a first terminal of the capacitor C1, and a second terminal of the transistor Tr1 is electrically connected to the wiring DL, and a gate of the transistor Tr1 is electrically connected to the wiring GL.

Note that in this embodiment, a point of electrical connection between the first terminal of the transistor Tr1, the first terminal of the capacitor C1, and the first terminal of the liquid crystal element LC is referred to as a node ND1.

The second terminal of the liquid crystal element LC is electrically connected to the wiring VCOM. In addition, a second terminal of the capacitor C1 is electrically connected to the wiring VCOM.

The capacitor C1 has a function of storing a potential difference between the first terminal of the transistor Tr1 and the wiring VCOM. In addition, the capacitor C1 can correspond to the capacitor Cs included in the pixel PIX illustrated in FIG. 3. In this case, the wiring VC illustrated in FIG. 3 can correspond to the wiring VCOM in FIG. 4(A1). Note that since the capacitor C1 only needs to have a function of storing the potential of the first terminal of the capacitor C1, the second terminal of the capacitor C1 may be electrically connected to a wiring that supplies a constant potential other than the wiring VCOM.

In addition, in the pixel PIX illustrated in FIG. 4(A1), the transistor Tr1 and the capacitor C1 can correspond to circuit elements included in the image data storage portion 101 in the pixel PIX illustrated in FIG. 2(A). In addition, in the pixel PIX illustrated in FIG. 4(A1), the liquid crystal element LC can correspond to the display element 103 of the pixel PIX illustrated in FIG. 2(A).

By storing a potential corresponding to the image data in the node ND1, the liquid crystal molecules contained in the liquid crystal element LC aligns in accordance with a first-terminal-to-second-terminal voltage across the liquid crystal element LC in the pixel PIX illustrated in FIG. 4(A1). Light corresponding to image data can be emitted from the pixel PIX as the aligned liquid crystal molecules transmit light from the backlight unit included in the display device or reflect light incident from outside the display device with the reflective electrodes included in the display device.

In the pixel PIX in FIG. 4(A1), the transistor Tr1 is preferably an OS transistor. In particular, an OS transistor is preferably an oxide containing at least one of indium, an element M (the element M is aluminum, gallium, yttrium, or tin), and zinc in a channel formation region. The oxide will be described in detail in Embodiment 4. The application of such an OS transistor to the transistor Tr1 enables the off-state current of the transistor to be extremely low. In the case where data is stored at the first terminal of the capacitor C1 (the node ND1), when the transistor Tr1 is an OS transistor, data stored at the node ND1 can be prevented from being corrupted by the off-state current.

In addition, a transistor including silicon in a channel formation region (hereinafter referred to as a Si transistor) can be used as the transistor Tr1. For example, hydrogenated amorphous silicon, microcrystalline silicon, or polycrystalline silicon can be used as silicon.

Note that the transistor Tr1 illustrated in FIG. 4(A1) may be a transistor including a back gate. The pixel PIX illustrated in FIG. 4(A2) has a structure in which the transistor Tr1 included in the pixel PIX illustrated in FIG. 4(A1) is provided with a back gate. In FIG. 4(A2), the gate and the back gate of the transistor Tr1 are electrically connected to each other. A transistor with a gate and a back gate that are electrically connected to each other can increase the on-state current that flows through the transistor; thus, with the structure of the pixel PIX in FIG. 4(A2), the pixel PIX can operate at high speed. Note that the pixel PIX in FIG. 4(A2) has a structure in which the gate and the back gate of the transistor Tr1 are connected to each other; however, the pixel PIX may have a structure in which the back gate of the transistor Tr1 is supplied with a potential from another wiring.

In addition, an example of a circuit structure different from that in FIGS. 4(A1) and 4(A2) and applicable to the pixel PIX illustrated in FIG. 1 to FIG. 3 will be described.

A pixel PIX illustrated in FIG. 4(B1) includes a transistor Tr2 to a transistor Tr4, a capacitor C2, and a light-emitting element LD. Furthermore, the wiring DL, a wiring GL1, a wiring AL, a wiring VL, and a wiring CAT are electrically connected to the pixel PIX.

The transistor Tr2 and the transistor Tr4 each function as a switching element. As image data write is performed by controlling the transistor Tr2, the transistor Tr2 can correspond to the switch SWC included in the pixel PIX in FIG. 3. The transistor Tr3 functions as a driving transistor that controls current flowing to the light-emitting element LD. In addition, the structures described in Embodiment 3 can be used for the transistor Tr2 to the transistor Tr4.

The wiring DL is a wiring for transmitting image data to the pixel PIX and can correspond to the wiring SL illustrated in FIG. 1 to FIG. 3. Additionally, the wiring GL1 is a selection signal line to the pixel PIX, and can correspond to the wiring GL in FIG. 1 and FIG. 2.

The wiring VL is a wiring for supplying a predetermined potential to a specific node in the pixel PIX. Additionally, the wiring AL is a wiring for supplying current to flow into the light-emitting element LD. The wiring VL and the wiring AL can correspond to the wiring VA illustrated in FIG. 2.

The wiring CAT is a wiring for supplying a predetermined potential to an output terminal of the light-emitting element LD. The predetermined potential can be, for example, a reference potential, a low-level potential, or a potential lower than these potentials. The wiring CAT can correspond to the wiring VA illustrated in FIG. 2. The wiring CAT preferably functions as a wiring that supplies a common potential in a plurality of pixels PIX included in the display portion PA.

A first terminal of the transistor Tr2 is electrically connected to a first terminal of the capacitor C2 and a gate of the transistor Tr3, a second terminal of the transistor Tr2 is electrically connected to the wiring DL, and a gate of the transistor Tr2 is electrically connected to the wiring GL1. A first terminal of the transistor Tr3 is electrically connected to the wiring AL, a second terminal of the transistor Tr3 is electrically connected to a second terminal of the capacitor C2, a first terminal of the transistor Tr4, and an input terminal of the light-emitting element LD. A second terminal of the transistor Tr4 is electrically connected to the wiring VL, and a gate of the transistor Tr4 is electrically connected to the wiring GL1. The output terminal of the light-emitting element LD is electrically connected to the wiring CAT.

Note that in this embodiment, a point of electrical connection between the first terminal of the transistor Tr2, the first terminal of the capacitor C2, and the gate of the transistor Tr3 is referred to as a node ND2.

The capacitor C2 has a function of storing a potential difference between the second terminal and the gate of the transistor Tr3. The capacitor C2 can correspond to the capacitor Cs included in the pixel PIX illustrated in FIG. 3.

In addition, in the pixel PIX illustrated in FIG. 4(B1), the transistor Tr2 and the capacitor C2 can correspond to circuit elements included in the image data storage portion 101 in the pixel PIX illustrated in FIG. 2(B). In addition, in the pixel PIX illustrated in FIG. 4(B1), the transistor Tr3 and the transistor Tr4 can correspond to circuit elements included in the driver circuit portion 102 in the pixel PIX illustrated in FIG. 2(B). In addition, in the pixel PIX illustrated in FIG. 4(B1), the light-emitting element LD can correspond to the display element 103 in the pixel PIX illustrated in FIG. 2(B).

By storing a potential corresponding to the image data at the node ND2, current in accordance with a gate-source voltage of the transistor Tr3, which is a driving transistor, flows between the source-drain of the transistor Tr3 in the pixel PIX illustrated in FIG. 4(B1). The current flows into the input terminal of the light-emitting element LD, so that the light-emitting element LD emits light. Thus, the pixel PIX can emit light corresponding to the image data.

In the pixel PIX in FIG. 4(B1), at least one of the transistor Tr2 to the transistor Tr4 is preferably an OS transistor. In particular, an OS transistor is preferably an oxide containing at least one of indium, an element M (the element M is aluminum, gallium, yttrium, or tin), and zinc in a channel formation region. The oxide will be described in detail in Embodiment 4. The application of such an OS transistor to at least one of the transistor Tr2 to the transistor Tr4 enables the off-state current of the applied transistor to be extremely low. In the case where data is stored at the first terminal of the capacitor C2 (the node ND2), when the transistor Tr2 is an OS transistor, data stored at the node ND2 can prevented from being corrupted by the off-state current. In addition, by applying the OS transistor to all of the transistor Tr2 to the transistor Tr4, the transistors can be formed at the same time, allowing a shortening of manufacturing steps of the display portion PA in some cases. Thus, the number of parts manufactured per given length of time can be increased as the throughput time of the display portion PA can be shortened.

In addition, a Si transistor including silicon in a channel formation region can be applied to at least one of the transistor Tr2 to the transistor Tr4, for example. For example, hydrogenated amorphous silicon, microcrystalline silicon, or polycrystalline silicon can be used as silicon.

In addition, the channel formation regions of the transistor Tr2 to the transistor Tr4 are preferably the same material. In addition, depending on the circumstances, the pixels PIX may have a structure in which some of the transistor Tr2 to the transistor Tr4 are Si transistors and the other transistors are OS transistors.

Note that in the pixel PIX in FIG. 4(B1), an input terminal of the light-emitting element LD may be provided with a switching element. The pixel PIX illustrated in FIG. 4(B2) has a structure in which the transistor Tr5 is provided between the second terminal of the transistor Tr3, the second terminal of the capacitor C2, the first terminal of the transistor Tr4, and the light-emitting element LD. That is, a first terminal of the transistor Tr5 is electrically connected to the second terminal of the transistor Tr3, the second terminal of the capacitor C2, and the first terminal of the transistor Tr4, and a second terminal of the transistor Tr5 is electrically connected to the input terminal of the light-emitting element LD. A gate of the transistor Tr5 is electrically connected to a wiring GL2 that is one of selection signal lines.

In the case of the pixel PIX illustrated in FIG. 4(B1), stopping the flow of current to the input terminal of the light-emitting element LD will stop the light-emitting element LD from emitting light; thus, measures such as lowering the potential applied to the wiring AL may be taken at that timing. In this case, a driver circuit for controlling the wiring AL needs to be additionally provided, which may increase the manufacturing cost of the display device. In contrast, in the pixel PIX illustrated in FIG. 4(B2), the supply of current to the light-emitting element LD may be stopped by applying a low-level potential to the wiring GL2 to bring the transistor Tr5 into an off state. In addition, when the transistor Tr5 is the above OS transistor, light emission from the light-emitting element LD due to an off-state current can be prevented.

In addition, in the pixel PIX illustrated in FIG. 4(B2), the transistor Tr5 can correspond to the circuit elements included in the driver circuit portion 102 in the pixel PIX illustrated in FIG. 2(B).

<Circuit Structure Example of Correction Data Storage Portion>

Next, a circuit structure example that can be used for the correction data storage portion 104 illustrated in FIG. 1 to FIG. 3 will be described.

Figure 5A:
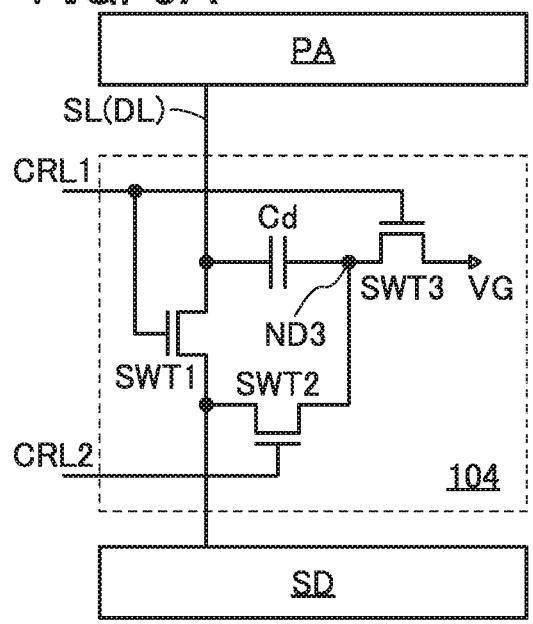
FIGS. 5A-5B Circuit diagrams illustrating examples of a display device.

A correction data storage portion 104 illustrated in FIG. 5(A) is a circuit structure example in which a transistor SWT1 to a transistor SWT3 are used as the switch SW1 to the switch SW3 in the correction data storage portion 104 illustrated in FIG. 3. Note that in FIG. 5(A), the display portion PA and the source driver circuit SD are illustrated to show their connection relation between the correction data storage portion 104.

A first terminal of the transistor SWT1 is electrically connected to a first terminal of the capacitor Cd and the wiring SL (the wiring DL); a second terminal of the transistor SWT1 is electrically connected to a first terminal of the transistor SWT2 and the source driver circuit SD, and a gate of the transistor SWT1 is electrically connected to a wiring CRL1. A gate of the transistor SWT2 is electrically connected to a wiring CRL2. A first terminal of the transistor SWT3 is electrically connected to a second terminal of the capacitor Cd and a second terminal of the transistor SWT2, a second terminal of the transistor SWT3 is electrically connected to the wiring VG, and a gate of the transistor SWT3 is electrically connected to the wiring CRL1.

Note that in FIG. 5, in the same manner as FIG. 3, the point of electrical connection between the second terminal of the transistor SWT2, the second terminal of the capacitor Cd, and the first terminal of the transistor SWT3 is referred to as a node ND3.

The wiring CRL1 and the wiring CRL2 are wirings for switching the transistor SWT1 to the transistor SWT3 between an on state and an off state. In particular, since the gate of each of the transistor SWT1 and the transistor SWT3 is electrically connected to the wiring CRL1, switching between the on and the off states of the transistor SWT1 and the transistor SWT3 can be performed at the same time by supplying a high-level potential or a low-level potential to the wiring CRL1. Note that the switching between the on state and the off state of the transistor SWT1 and the transistor SWT3 does not need to be performed at the same time, and the switching between the on state and the off state of the transistor SWT1 and the transistor SWT3 can be performed independently from each other. In that case, the correction data storage portion 104 may have a structure in which the gates of the transistor SWT1 and the transistor SWT3 are electrically connected to different wirings.

An OS transistor is preferably used as at least one of the transistor SWT1 to the transistor SWT3. The OS transistor is characterized by its extremely low off-state current; thus, for example, when the OS transistor is used as the transistor SWT2 and/or the transistor SWT3, corruption of data stored at the node ND3 caused by the off-state current can be prevented. In addition, when all of the transistor SWT1 to the transistor SWT3 are OS transistors, the transistors can be formed at the same time, allowing a shortening of manufacturing steps of the display portion PA in some cases.

Figure 5B:
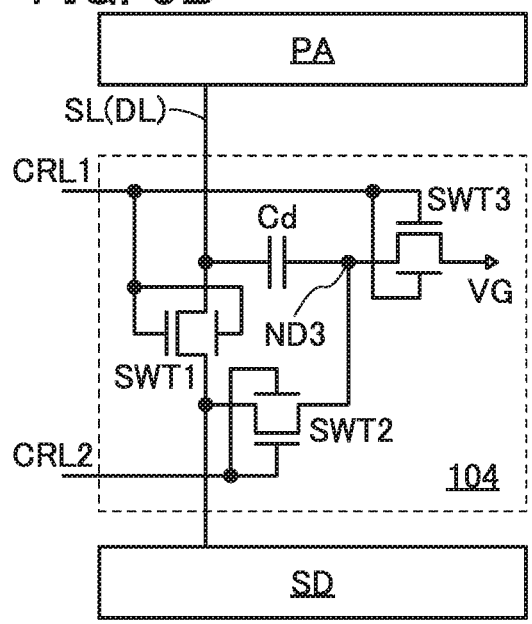

In addition, at least one of the transistor SWT1 to the transistor SWT3 illustrated in FIG. 5(A) may be a transistor including a back gate. In FIG. 5(B), all of the transistor SWT1 to the transistor SWT3 are transistors including back gates, and the each transistor has a gate and a back gate electrically connected to each other. A transistor with a gate and a back gate that are electrically connected to each other can increase the on-state current that flows through the transistor; thus, with the structure of the pixel PIX in FIG. 5(B), the pixel PIX can operate at a high speed. Note that the pixel PIX in FIG. 5(B) has a structure in which the gate and the back gate are connected to each other in each of the transistor SWT1 to the transistor SWT3; however, the pixel PIX may have a structure in which the back gate of each transistor is supplied with a potential from a different wiring.

In addition, a Si transistor may be applied to at least one of the transistor SWT1 to the transistor SWT3. In addition, some of the transistor SWT1 to the transistor SWT3 may be Si transistors and the other transistors may be OS transistors.

Although FIGS. 5(A) and 5(B) illustrate a circuit structure example in which the transistor SWT1 to the transistor SWT3 are applied to the switch SW1 to the switch SW3 in the correction data storage portion 104 illustrated in FIG. 3, the switch SW1 to the switch SW3 in the correction data storage portion 104 illustrated in FIG. 3 may each be a switch configured with a CMOS (complementary MOS) circuit, e.g., an analog switch.

Further, in the case where the correction data storage portion 104 and the pixel PIX are formed over the same substrate, the channel formation region of each of the transistor SWT1 to the transistor SWT3 and the transistor included in the pixel PIX is preferably formed of the same material.

In addition, in the case where the channel formation region of each of the transistors included in the correction data storage portion 104 and the source driver circuit SD is formed of the same material, the correction data storage portion 104 and the source driver circuit SD are preferably formed over the same semiconductor substrate. In addition, in the case where the channel formation regions of the transistors included in the correction data storage portion 104 and the source driver circuit SD are formed of different materials, a stacked structure, in which the source driver circuit SD is formed over a semiconductor substrate and the correction data storage portion 104 is formed above the source driver circuit SD, is preferable. In this case, the transistor SWT1 to the transistor SWT3 in the correction data storage portion 104 can be configured to be OS transistors, and the source driver circuit SD can be configured with Si transistors. Further, the correction data storage portion 104 and the source driver circuit SD may have a structure in which a substrate with the correction data storage portion 104 formed thereover is mounted on a semiconductor substrate with the source driver circuit SD formed thereover. In addition, the source driver circuit SD may have a structure that includes the correction data storage portion 104 therein.

Note that insulating substrates such as a glass substrate, a quartz substrate, a sapphire substrate, a stabilized zirconia substrate (such as an yttria-stabilized zirconia substrate), and a resin substrate are given as examples of a substrate over which the pixel PIX, the correction data storage portion 104, the source driver circuit SD, and the like are formed. In addition, a semiconductor substrate of silicon, germanium, or the like and a compound semiconductor substrate containing silicon carbide, silicon germanium, gallium arsenide, indium phosphide, zinc oxide, or gallium oxide are given as examples of the substrate. In addition, a silicon on insulator (SOI) substrate including an insulating region within a semiconductor substrate is given as an example of the substrate. In addition, conductive substrates such as a graphite substrate, a metal substrate, an alloy substrate, a conductive resin substrate, and the like are given as examples of the substrate.

<<Operation Example>>

Next, the operation example of the display device of one embodiment of the present invention is described. Note that the display device in this operation example is a display device DD3 illustrated in FIG. 6. The display device DD3 has a configuration where the display device DD1 has the pixel PIX illustrated in FIG. 4(A1) as the pixel PIX, the wiring SL illustrated in FIG. 3 as the wiring SL, and the correction data storage portion 104 illustrated in FIG. 5(A) as the correction data storage portion 104. Note that in FIG. 6, when a capacitor Cpa is a sum of the capacitors Cp that represent the parasitic capacitances of the wiring SL illustrated in FIG. 3, and when there are N pixels electrically connected to the wiring SL, Cpa=N×Cp is satisfied. In addition, in FIG. 6, the resistor Rp that represents the wire resistance of the wiring SL illustrated in FIG. 3 is omitted. In addition, in the source driver circuit SD illustrated in FIG. 6, only the amplifier circuit AMP is illustrated, and circuits and elements that are electrically connected to the input terminal of the amplifier circuit are omitted.

Figure 7:
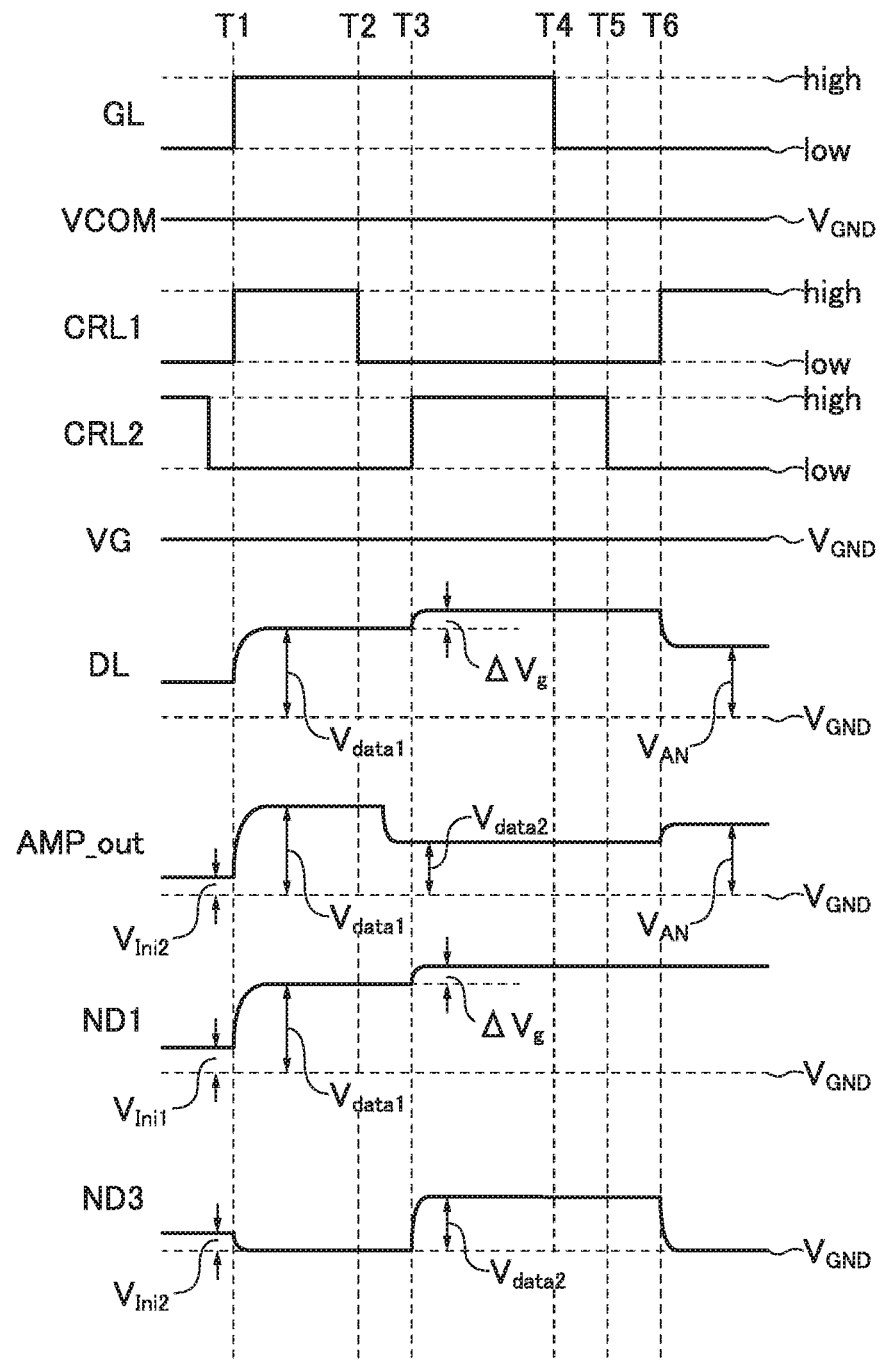
FIG. 7 A timing chart illustrating an operation example of a display device.

FIG. 7 is a timing chart describing an operation example of the display device DD3. The timing chart in FIG. 7 shows changes in the potential of the wiring GL, the wiring VCOM, the wiring CRL1, the wiring CRL2, the wiring VG, the wiring DL, the output voltage of the amplifier circuit (represented by AMP_out in FIG. 7), the node ND1, and the node ND3, during the time from Time T1 to Time T6 and the vicinities thereof. Note that high described in FIG. 7 indicates a high-level potential, and low indicates a low-level potential. In addition, $V_{GND}$ described in FIG. 7 indicates a reference potential.

Note that $V_{GND}$ is assumed to be constantly applied to the wiring VCOM and the wiring VG during the time from Time T1 to Time T6 and the vicinities thereof.

Note that unless otherwise specified, this operation example includes a case, where the transistor Tr1 and the transistor SWT1 to the transistor SWT3, when in the on-state, operate in the linear region in the end. In other words, it is considered to include a case in which the gate voltage, the source voltage, and the drain voltage of the transistor Tr1 and the transistor SWT1 to the transistor SWT3 are biased appropriately to a voltage range that enables operation in the linear region. Note that in the case where the pixel PIX illustrated in the pixel PIX in FIGS. 4(B1) and 4(B2) is used as the pixel PIX in the display device DD1, operating the transistor Tr2 and the transistor Tr4 in a linear region and operating the transistor Tr3 in a saturation region is preferable.

[Before Time T1]

Before Time T1, a low-level potential is applied to the wiring GL. When the potential of the wiring GL is a low-level potential, a low-level potential is applied to the gate of the transistor Tr1; thus, the transistor Tr1 enters an off state. That is, a non-conducting state is established between the wiring DL and the node ND1.

In addition, a low-level potential is applied to the wiring CRL1. When the potential of the wiring CRL1 is a low-level potential, a low-level potential is applied to gates of each of the transistor SWT1 and the transistor SWT3; thus, each of the transistor SWT1 and the transistor SWT3 enters an off state. That is, a non-conducting state is established between the source driver circuit SD and the display portion PA, and a non-conducting state is also established between the node ND3 and the wiring VG.

When a potential difference greater than or equal to a certain level is created between the first terminal (the node ND1) and the second terminal of the liquid crystal element LC, liquid crystal molecules contained in the liquid crystal element LC align in accordance with the potential difference. The aligned liquid crystal molecules transmit light from a backlight unit included in the display device DD1, whereby the light is emitted from the pixel PIX. The intensity of the light is determined by a voltage applied between the first terminal (the node ND1) and the second terminal of the liquid crystal element LC, that is, the potential of the node ND1; thus, adjusting the potential enables an expression of gradation levels. Note that before Time T1 in the timing chart shown in FIG. 7, it is assumed that there is a potential difference, between the first terminal (the node ND1) and the second terminal of the liquid crystal element LC, that is at a level that prevents light emission from the pixel PIX; such a potential is denoted as $V_{Ini1}$. That is, in the timing chart shown in FIG. 7, the potential of the node ND1 is denoted as $V_{Ini1}$. Note that $V_{Ini1}$ may be $V_{GND}$ or a potential lower than $V_{GND}$. In this operation example, description will be made assuming that $V_{Ini1}$ is a potential higher than $V_{GND}$ but not at a level that prevents light emission from the pixel PIX.

Before Time T1, the potential of the wiring CRL2 changes from a high-level potential to a low-level potential. When the potential of the wiring CRL2 is a high-level potential, a high-level potential is applied to the gate of the transistor SWT2 so that the transistor SWT2 enters an on state. That is, a non-conducting state is established between the source driver circuit SD and the node ND3. At this time, a potential output from the output terminal of the amplifier circuit AMP of the source driver circuit SD is applied to the node ND3. In addition, when the potential of the wiring CRL2 becomes a low-level potential, the transistor SWT2 is turned off, so that a non-conducting state is established between the source driver circuit SD and the node ND3.

To briefly describe this operation example, the potential of the node ND3 before Time T1 is denoted as $V_{Ini2}$. Note that although $V_{Ini2}$ may be $V_{GND}$ or a potential lower than $V_{GND}$, for this operation example $V_{Ini2}$ is assumed to be a potential higher than $V_{GND}$.

Before Time T1, it is assumed that the wiring DL is an appropriate potential. Note that in FIG. 7, the potential of the wiring DL is illustrated as a potential higher than $V_{GND}$.

[Time T1]

At Time T1, a high-level potential is applied to the wiring GL. Thus, in a period from Time T1 to Time T2, a high-level potential is supplied to the gate of the transistor Tr1, so that the transistor Tr1 enters an on state. Thus, a conducting state is established between the wiring DL and the source driver circuit SD.

In addition, at Time T1, a high-level potential is applied to the wiring CRL1. Thus, in a period from Time T1 to Time T2, a high-level potential is applied to the gate of each of the transistor SWT1 and the transistor SWT3, so that the transistor SWT1 and the transistor SWT3 enter an on state. A conducting state is established between the wiring ND3 and the wiring VG.

Here, at Time T1, it is assumed that the potential $V_{data1}$ is output from the output terminal of the amplifier circuit as an analog signal. $V_{data1}$ is a potential output from the digital-analog converter circuit DAC included in the source driver circuit SD. At this time, the transistor SWT1 is in an on state, so that the potential of the wiring DL becomes $V_{data1}$. In addition, the transistor Tr1 is in an on state, so that the potential of the node ND1 of the pixel PIX also becomes $V_{data1}$.

In contrast, the transistor SWT3 is in an on state, so that the potential of the node ND3 becomes $V_{GND}$. In addition, the transistor SWT2 is in an off state, so that the potential $V_{data1}$ output from the output terminal of the amplifier circuit AMP is not applied to the node ND3.

At this time, a first-terminal-to-second-terminal voltage of the capacitor Cd becomes $V_{data1}$.

[Time T2]

At Time T2, a low-level potential is applied to the wiring CRL1. Therefore, in a period from Time T2 to Time T3, a low-level potential is applied to the gate of each of the transistor SWT1 and the transistor SWT3, so that each of the transistor SWT1 and the transistor SWT3 enter an off state.

When the transistor SWT1 enters an off state, a non-conducting state is established between the wiring DL and the source driver circuit SD. Thus, the wiring DL and the node ND1 enter an electrically floating state. When the transistor SWT3 enters an off state, a non-conducting state is established between the node ND3 and the wiring VG so that the node ND3 enters an electrically floating state.

Further, in a period from Time T2 to Time T3, it is assumed that a potential $V_{data2}$ is output from an output terminal of the amplifier circuit AMP as an analog signal. In a similar manner to $V_{data1}$, $V_{data2}$ is a potential which can be output from the digital-analog converter circuit DAC included in the source driver circuit SD.

[Time T3]

At Time T3, a high-level potential is applied to the wiring CRL2. Thus, in a period from Time T3 to Time T4, a high-level potential is applied to the gate of the transistor SWT2, so that the transistor SWT2 enters an on state.

At this time, since the transistor SWT2 is in an on state, the potential $V_{data2}$ output from the output terminal of the amplifier circuit AMP is applied to the node ND3. In addition, since the transistor SWT3 is in an off state, current does not flow from the source driver circuit SD to the wiring VG, and the potential of the node ND3 increases from $V_{GND}$ to $V_{data2}$.

In addition, since the wiring DL and the node ND1 are in an electrically floating state, changes in the potential of the node ND3 cause changes in the potential of each of the wiring DL and the node ND1, through capacitive coupling of the capacitor Cd. In the timing chart of FIG. 7, the amount of change in potentials of each of the wiring DL and the node ND1 is represented by $\Delta V_g$; however, when the capacitance value of the capacitor Cd is denoted as $C_A$ and the capacitance value that is obtained by combination of the capacitor Cpa, which represents the parasitic capacitance of the wiring SL, and the capacitor C1 of the pixel PIX, is denoted as $C_B$, $\Delta V_g$ can be estimated by Formula (E1) shown below.

[Formula 1]

$$\Delta V_g = \frac{C_A}{C_A + C_B} V_{data2} \quad (E1)$$

Therefore, when the potential of the node ND1 is set to $V_{ND1}$, $V_{ND1}$ is expressed by Formula (E2) shown below:

[Formula 2]

$$V_{ND1} = V_{data1} + \frac{C_A}{C_A + C_B} V_{data2} \quad (E2)$$

Note that in Formula (E1) and Formula (E2), the parasitic capacitance generated between the first terminal and the second terminal of the liquid crystal element LC is ignored. However, the first terminal of the liquid crystal element LC and the first terminal of the capacitor C1 are electrically connected to each other, and the second terminal of the liquid crystal element LC and the second terminal of the capacitor C1 are electrically connected to the wiring VCOM; therefore, the two elements can be regarded as being electrically connected in parallel. Therefore, the capacitance $C_B$ in Formula (E1) and Formula (E2) can be treated as a value determined in consideration of the parasitic capacitance of the liquid crystal element.

[Time T4]

At Time T4, a low-level potential is applied to the wiring GL. Thus, in a period from Time T4 to Time T5, a low-level potential is supplied to the gate of the transistor Tr1, so that the transistor Tr1 enters an off state.

When the transistor Tr1 enters an off state, a non-conducting state is established between the wiring DL and the node ND1. Therefore, the potential $V_{ND1}$ of the node ND1 is stored by the capacitor C1.

[Time T5]

At Time T5, a low-level potential is applied to the wiring CRL2. Thus, in a period from Time T5 to Time T6, a low-level potential is supplied to the gate of the transistor SWT2, so that the transistor SWT2 enters an off state.

When the transistor SWT2 enters an off state, a non-conducting state is established between the source driver circuit SD and the node ND3. In addition, since the transistor SWT3 is in an off state, the node ND3 enters an electrically floating state. Therefore, the potential of the node ND3 is stored by the capacitor Cd.

[Time T6]

At Time T6, a high-level potential is applied to the wiring CRL1. Thus, from Time T6 and later, a high-level potential is supplied to the gate of each of the transistor SWT1 and the transistor SWT3. Therefore, each of the transistor SWT1 and the transistor SWT3 enters an on state.

In addition, at Time T6, it is assumed that a potential VAN is output from an output terminal of the amplifier circuit AMP as an analog signal. VAN is a potential that the digital-analog converter circuit DAC in the source driver circuit SD can output as in $V_{data1}$ and $V_{data2}$.

Since the transistor SWT1 is in an on state, the potential from the output terminal of the amplifier circuit AMP is applied to the wiring DL. Accordingly, the potential of the wiring DL becomes VAN.

In addition, since the transistor SWT3 is in an on state, the potential $V_{GND}$ from the wiring VG is applied to the node ND3.

Here, a focus is put on the liquid crystal element LC after Time T4. A voltage of $V_{ND1} = V_{data1} + \Delta V_g$ is applied between the first terminal and the second terminal of the liquid crystal element LC. Thus, after Time T4, liquid crystal molecules contained in the liquid crystal element LC align in accordance with the potential $V_{ND1}$, and light is emitted from the pixel PIX.

Note that the luminance of light emitted from the pixel PIX depends on the voltage applied between the first terminal and the second terminal of the liquid crystal element LC.

Figure 6:
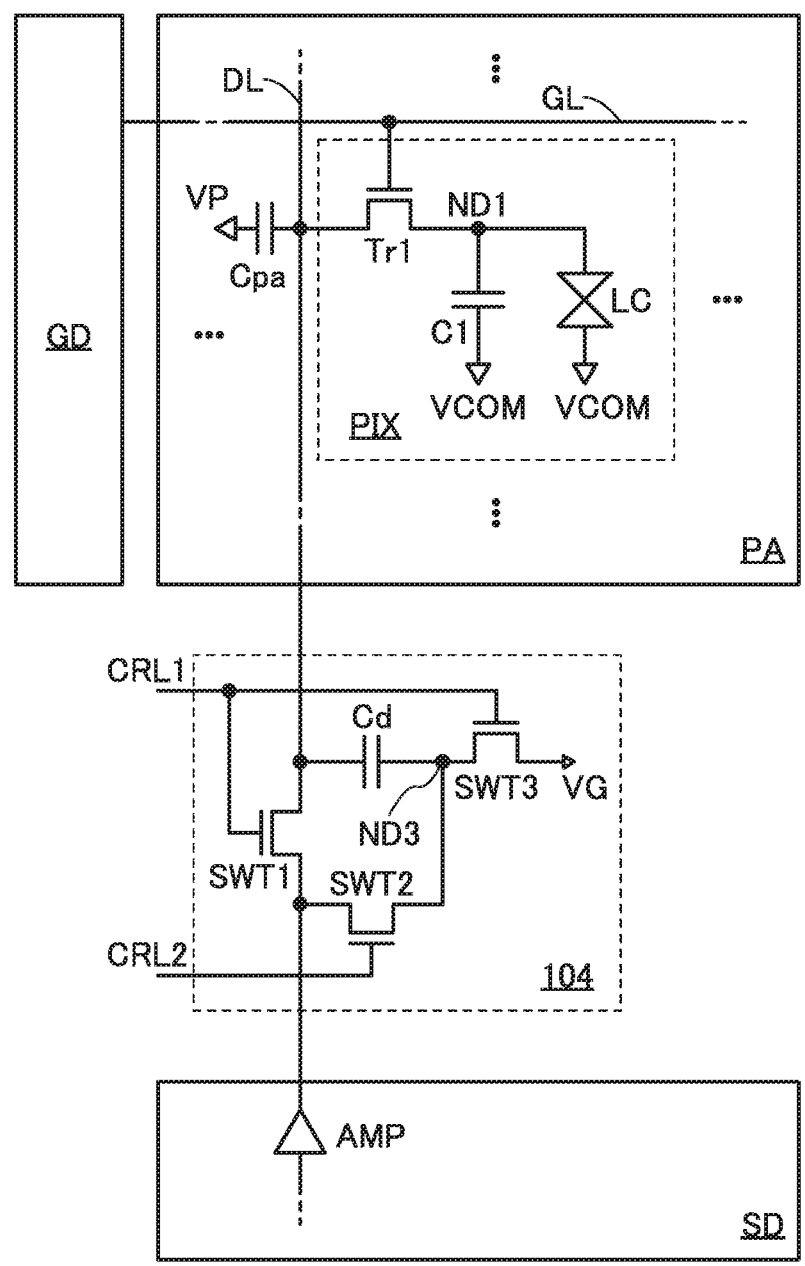
FIG. 6 A circuit diagram illustrating an example of a display device.

As described above, with the display device DD3 illustrated in FIG. 6 performing the operations of the time from Time T1 to Time T6 and the vicinities thereof in the timing chart of FIG. 7, the image data storage portion (node ND1)

of the pixel PIX can be supplied with a potential having a higher resolving power than the digital-analog converter circuit DAC.

Specific Example

Here, a description will be made on an example of displaying image data with more gradation levels than that of image data output from the digital-analog converter circuit DAC on the display portion PA of the display device DD3 according to the operation example described above.

In this example, it is assumed that a 6-bit digital-analog converter circuit is provided as the digital-analog converter circuit DAC in the driver circuit SD, and the ratio of capacitance $C_A$ of the capacitor Cd included in the correction data storage portion 104 and the capacitance $C_B$, a combined capacitance of capacitor Cpa representing the parasitic capacitance in the wiring SL and the capacitance of the capacitor C1 of the pixel PIX, is $C_A:C_B=1:63$.

By using a 6-bit digital-analog converter circuit DAC as the digital-analog converter circuit DAC, $V_{data1}$ that is written to the wiring DL and the node ND1 can have a value ranging from "000000" to "111111" in binary notation. Here, when the voltage value of "111111" is 6.3 V, the voltage value possible for $V_{data1}$ that can be output from the digital-analog converter circuit DAC is in the range of 0 V to 6.3 V in 0.1 V steps.

Thus, in the operation example described above, $V_{data1}$ with a range of 0 V to 6.3 V can be written to the wiring DL and the node ND1 in a period from Time T1 to Time T2.

The ratio of capacitance $C_A$ of the capacitor Cd and the capacitance $C_B$, a combined capacitance of capacitor Cpa representing the parasitic capacitance in the wiring SL and the capacitance of the capacitor C1 of the pixel PIX, is $C_A:C_B=1:63$; hence, Formula (E1) becomes Formula (E3) below.

[Formula 3]

$$\Delta V_g = \frac{1}{64} V_{data2} = \frac{1}{2^6} V_{data2} \quad (E3)$$

Here, in the case where a digital-analog converter circuit that outputs $V_{data2}$ is the same circuit as the digital-analog converter circuit DAC that outputs $V_{data1}$, for example, $V_{data2}$ can also have a value ranging from "000000" to "111111" in binary notation. In this case, a voltage value that $V_{data2}$ can have is also in the range of 0 V to 6.3 V in 0.1 V steps. That is, from Formula (E3), $\Delta V_g$ can have a value ranging from 0 V to 6.3/64 V (=0.0984375 V) in 0.1/64 V (=0.0015625 V) steps.

Thus, in the operation example described above, a potential of the node ND1 of the pixel PIX can have a value ranging from 0 V to 6.3+6.3/64 V (=6.3984375 V) in 0.1/64 V (=0.0015625 V) steps from Formulae (E2) and (E3), in a period from Time T3 to Time T4.

That is, by performing the above operation example in the display device DD1 to the display device DD3 of one embodiment of the present invention, a finer voltage value, which cannot be output from the 6-bit digital-analog converter circuit DAC, can be supplied to the node ND1 of the pixel PIX. In the above specific example, the digital-analog converter circuit DAC outputs a potential in 0.1 V steps; however, a potential can be written to the node ND1 of the pixel PIX in 0.1/64 V (=0.0015625 V) steps. In other words, a potential (image data) having higher resolving power than that of the 6-bit digital-analog converter circuit DAC can be written to the pixel PIX.

In the above specific example, the $V_{data1}$ supplied by the 6-bit digital-analog converter circuit DAC corresponds to high-order 6 bits of image data, and $\Delta V_g$ that is added to the node ND1 through capacitive coupling with the capacitor Cd of the correction data storage portion 104 corresponds to low-order 6 bits of image data. That is, with the use of any of the display device DD1 to the display device DD3 of one embodiment of the present invention, the high-order 6 bits of image data supplied by the digital-analog converter circuit DAC can be interpolated with the low-order 6 bits of image data, enabling 12-bit-equivalent image data to be displayed on the display portion PA.

In the operation example described above, in a period from Time T3 to Time T4, a potential higher than $V_{GND}$ is supplied as correction data to the node ND3 of the correction data storage portion 104; however, a potential that is lower than $V_{GND}$ may be supplied as correction data. That is, $\Delta V_g$ that is added to the node ND1 through capacitive coupling of the capacitor Cd of the correction data storage portion 104 may be a negative potential.

Note that the structure of a display device of one embodiment of the present invention is not limited to the structures illustrated in FIG. 1 to FIG. 3 and FIG. 6. One embodiment of the present invention can have a component of the display device changed as appropriate according to circumstances such as design specifications and the purpose, for example.

In addition, one structure example described in this embodiment can be combined with another structure example. For example, a structure, in which the transistor Tr2 to the transistor Tr4 in the pixel PIX illustrated in FIGS. 4(B1) and 4(B2) are provided with back gates in a similar manner to the pixel PIX in FIG. 4(A2) with the transistor Tr1 provided with a back gate, may be employed (not illustrated).

In addition, an operation method of a display device of one embodiment of the present invention is not limited to the above operation example or specific example. In the operation method, the sequence of supplying a potential to an element, a circuit, a wiring, or the like and the value of the potential can be changed as appropriate, for example. In addition, as described above, the structure of the display device of one embodiment of the present invention can be changed as appropriate; thus, the operation method of the display device may also be changed depending on the structure.

Note that this embodiment can be combined with other embodiments and/or an example in this specification as appropriate.

Embodiment 2

In this embodiment, structure examples of a display device including a liquid crystal element will be described. Note that a description in Embodiment 1, of the operation and function for adding low-order bits of image data to image data output from the source driver circuit SD, will be omitted in this embodiment.

Figure 8A:
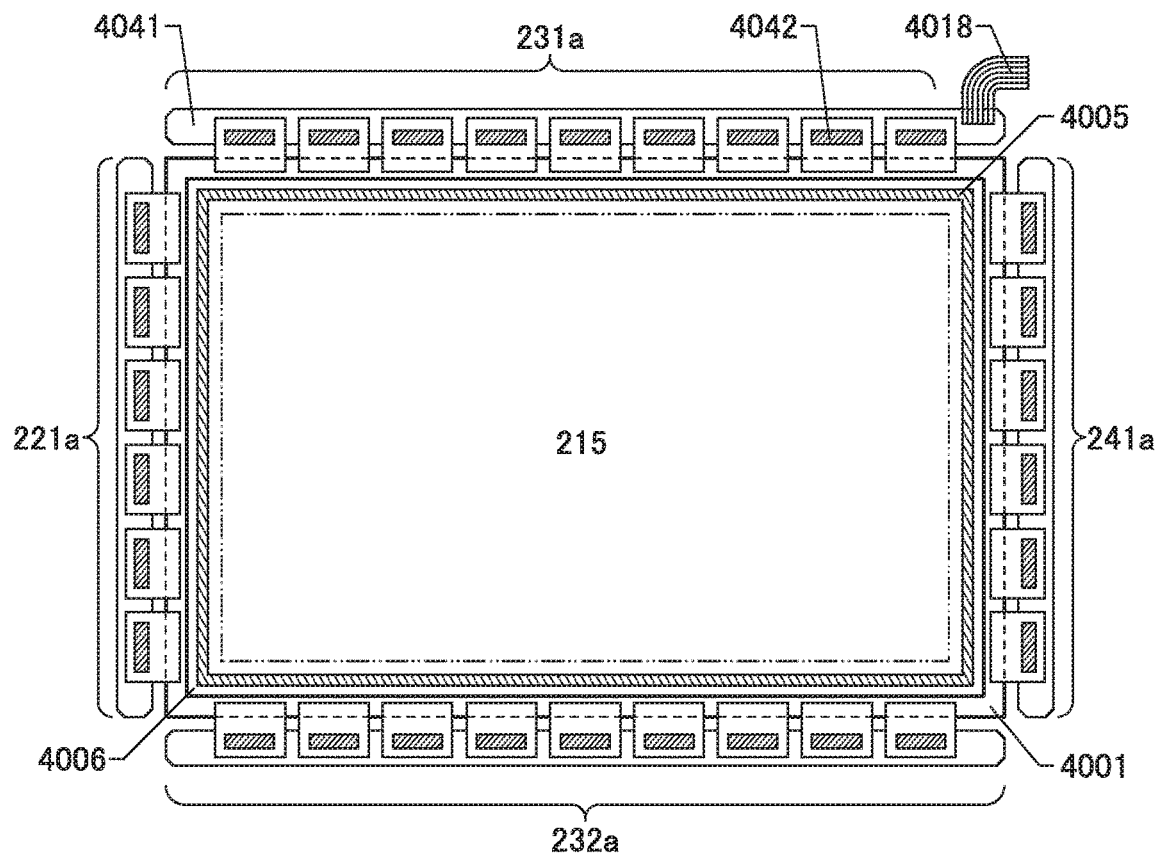
FIGS. 8A-8B Top views illustrating examples of display devices.

A display device illustrated in FIG. 8(A) includes a first substrate 4001 and a second substrate 4006. In the display device, a sealant 4005 is provided to surround a display portion 215 provided over the first substrate 4001, and the display portion 215 is sealed with the sealant 4005 and the second substrate 4006.

A pixel array including the pixels PIX described in Embodiment 1 is provided in the display portion 215.

In FIG. 8(A), a scan line driver circuit 221a, a signal line driver circuit 231a, a signal line driver circuit 232a, and a common line driver circuit 241a each include a plurality of integrated circuits 4042 provided over a printed board 4041. The integrated circuits 4042 are each formed using a single crystal semiconductor or a polycrystalline semiconductor. The signal line driver circuit 231a and the signal line driver circuit 232a each function as the source driver circuit SD described in Embodiment 1. The scan line driver circuit 221a functions as the gate driver circuit GD described in Embodiment 1. The common line driver circuit 241a has a function of supplying a predetermined potential to the wiring VCOM described in Embodiment 1.

Signals and potentials supplied to the scan line driver circuit 221a, the common line driver circuit 241a, the signal line driver circuit 231a, and the signal line driver circuit 232a are supplied through an FPC (FPC: Flexible Printed Circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying an image signal to the display portion 215. The integrated circuits 4042 are mounted in a region different from a region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

Figure 8B:
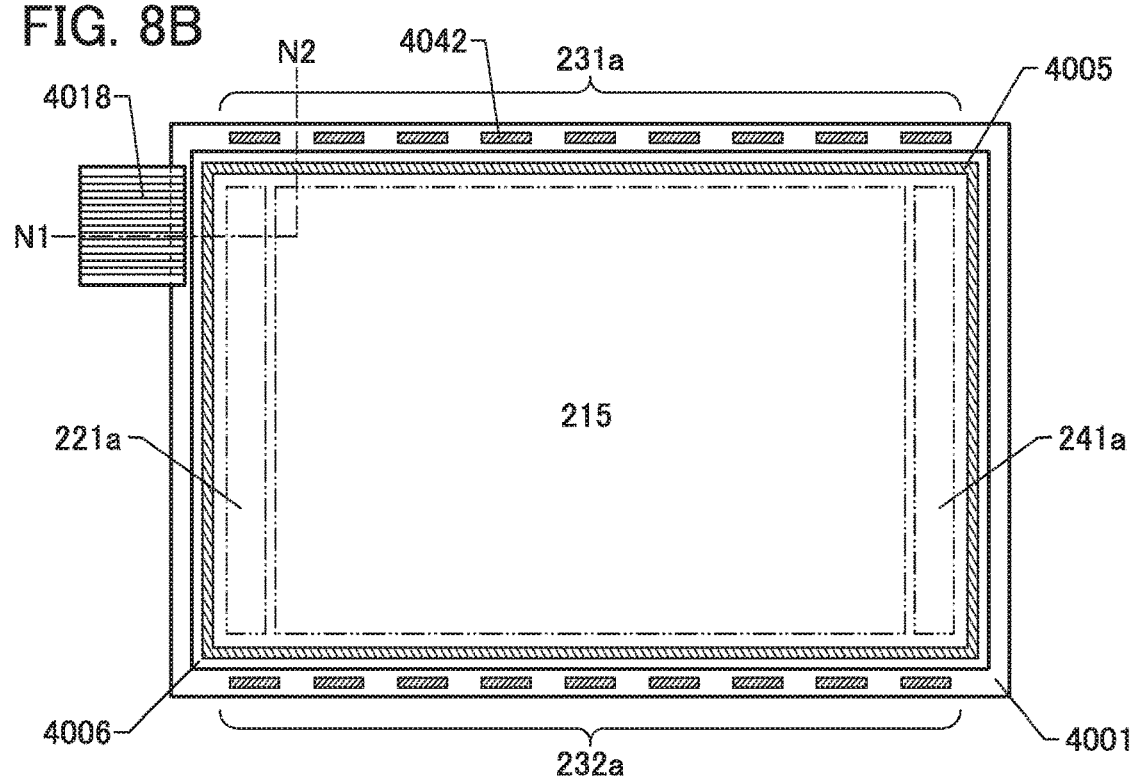

FIG. 8(B) shows an example of mounting the integrated circuits 4042 included in the signal line driver circuit 231a and the signal line driver circuit 232a by a COG method. Some or all of the driver circuits can be formed over the same substrate 4001 over which the display portion 215 is formed, whereby a system-on-panel can be obtained.

FIG. 8(B) illustrates an example in which the scan line driver circuit 221a and the common line driver circuit 241a are formed over the substrate over which the display portion 215 is formed. When the driver circuits are formed concurrently with the pixel circuit in the display portion 215, the number of components can be reduced. Accordingly, the productivity can be increased.

In addition, in FIG. 8(B), the sealant 4005 is provided to surround the display portion 215, the scan line driver circuit 221a, and the common line driver circuit 241a that are provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element with the use of the first substrate 4001, the sealant 4005, and the second substrate 4006.

Although FIG. 8(B) shows an example in which the signal line driver circuit 231a and the signal line driver circuit 232a are formed separately and mounted on the first substrate 4001, the structure is not limited thereto. The scan line driver circuits may be separately formed and then mounted, or part of the signal line driver circuits or part of the scan line driver circuits may be separately formed and then mounted.

In some cases, the display device encompasses a panel in which a display element is sealed, and a module in which an IC or the like including a controller is mounted on the panel.

The display portion and the scan line driver circuit provided over the first substrate each include a plurality of transistors. An OS transistor or a Si transistor can be used as the transistors.

Transistors included in the peripheral driver circuits and transistors included in the pixel circuits of the display portion may have the same structure or different structures. The transistors included in the peripheral driver circuits may have the same structure or a combination of two or more types of structures. Similarly, the transistors included in the pixel circuits may have the same structure or a combination of two or more types of structures.

An input device 4200 (not illustrated; descriptions on the input device 4200 will be made in later paragraphs) can be provided over the second substrate 4006.

The structure in which the display device illustrated in FIG. 8 are provided with the input device 4200 can be made to function as a touch panel.

There is no particular limitation on a detection element (also referred to as a sensor element) included in the touch panel of one embodiment of the present invention. A variety of sensors that can sense proximity or touch of a sensing target such as a finger or a stylus can be used as the sensor element.

For example, a variety of sensor types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive type include a surface-capacitive type and a projected-capacitive type. Examples of the projected-capacitive type include a self-capacitive type and a mutual-capacitive type. The use of a mutual-capacitive type is preferable because multiple points can be sensed simultaneously.

The touch panel of one embodiment of the present invention can have any of a variety of structures, including a structure in which a display device and a sensor element that are separately formed are bonded together and a structure in which an electrode and the like included in a sensor element are provided on one or both of a substrate supporting a display element and a counter substrate.

Figure 9A:
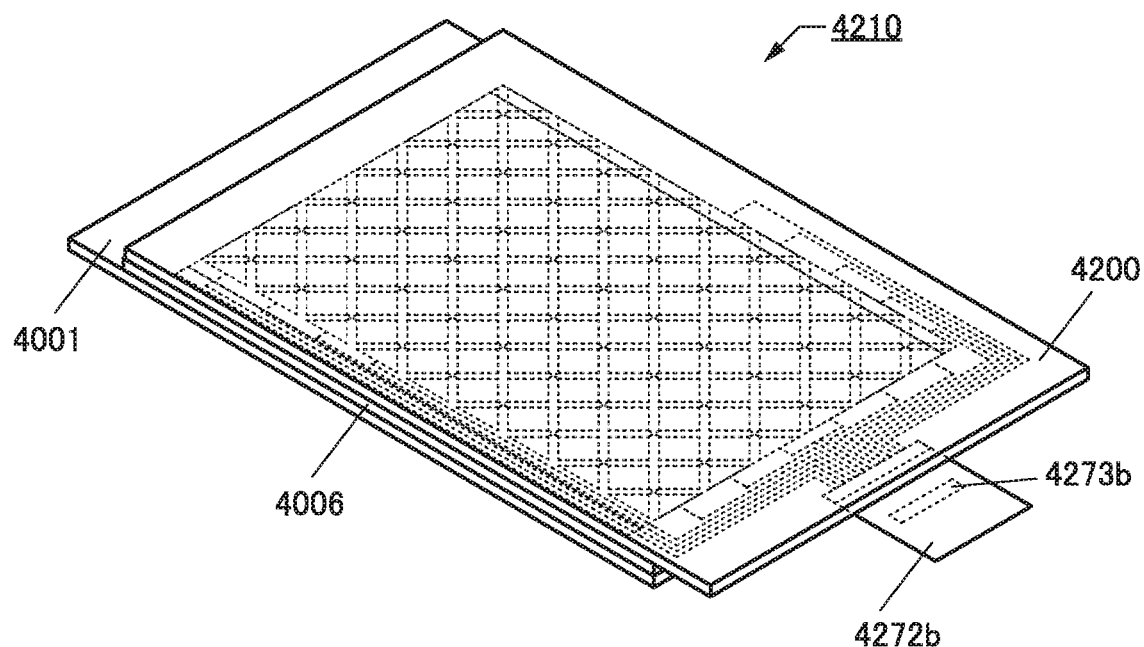
FIGS. 9A-9B Perspective views illustrating examples of a touch panel.
Figure 9B:
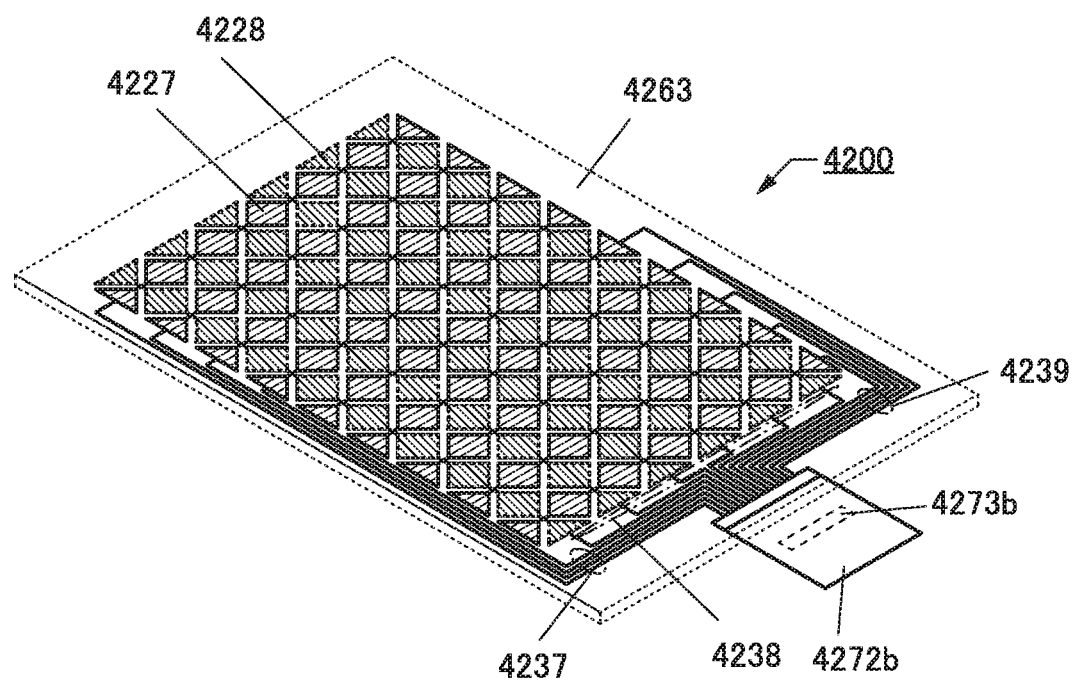

FIGS. 9(A) and 9(B) illustrate an example of a touch panel. FIG. 9(A) is a perspective view of a touch panel 4210. FIG. 9(B) is a schematic perspective view of the input device 4200. Note that for simplicity, only the major components are illustrated.

The touch panel 4210 has a structure in which a display device and a sensor element that are formed separately are bonded together.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239.

In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

Furthermore, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

Figure 10:
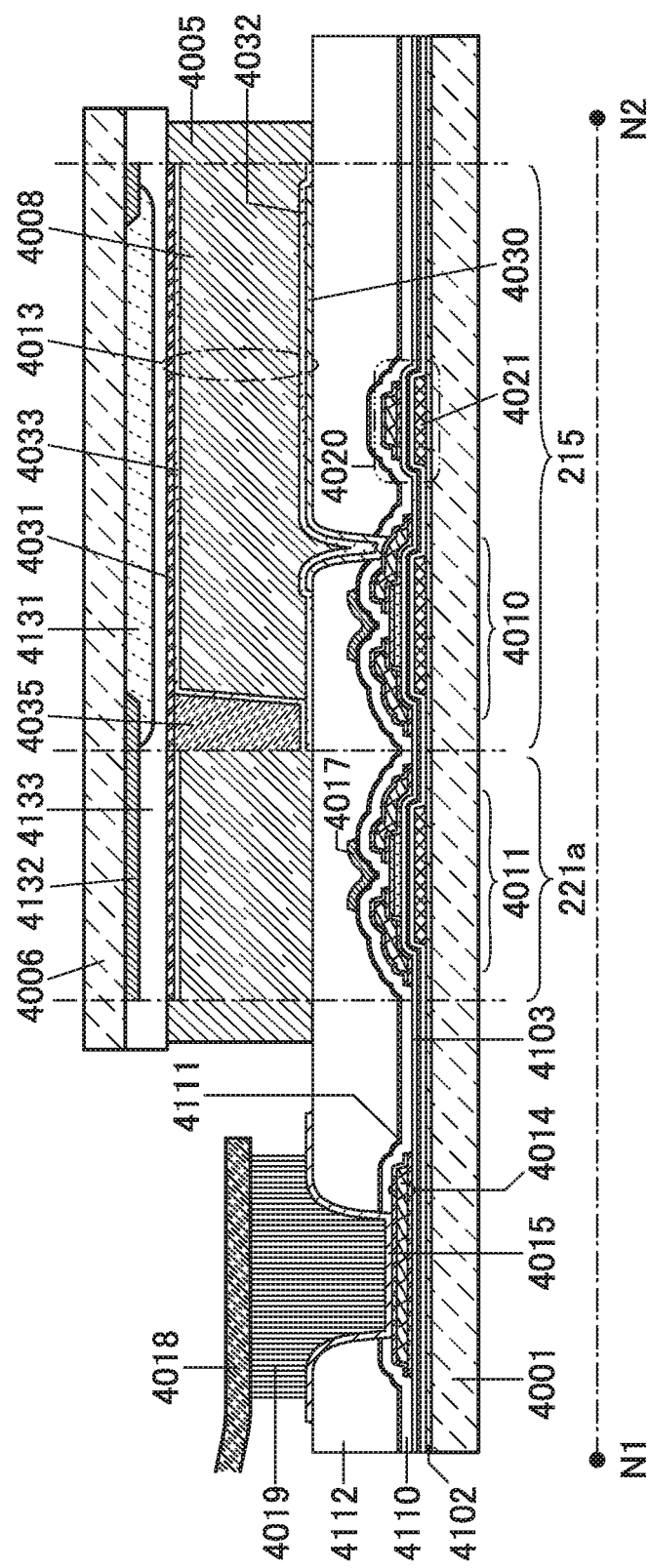
FIG. 10 A cross-sectional view illustrating an example of a display device.

FIG. 10 is a cross-sectional view taken along the chain line N1-N2 in FIG. 8(B). A display device illustrated in FIG. 10 includes an electrode 4015, and the electrode 4015 is electrically connected to a terminal included in the FPC 4018 through an anisotropic conductive layer 4019. In FIG. 10, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as a source electrode and a drain electrode of a transistor 4010 and a transistor 4011.

In addition, the display portion 215 and the scan line driver circuit 221a provided over the first substrate 4001 each include a plurality of transistors, and in FIG. 10, the transistor 4010 included in the display portion 215 and the transistor 4011 included in the scan line driver circuit 221a are shown as an example. Note that FIG. 10 illustrates bottom-gate transistors as the transistor 4010 and the transistor 4011 as an example, but they may be top-gate transistors. In addition, the transistor 4011 may be included in the gate driver circuit GD described in Embodiment 1.

In FIG. 10, the insulating layer 4112 is provided over the transistor 4010 and the transistor 4011.

In addition, the transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display device illustrated in FIG. 10 includes a capacitor 4020. The capacitor 4020 includes an electrode 4021 formed in the same step as a gate electrode of the transistor 4010, and an electrode formed in the same step as a source electrode and a drain electrode of the transistor 4010. Each of the electrodes overlap with each other with the insulating layer 4103 therebetween. Note that the capacitor 4020 can be the capacitor C1 of the pixel PIX described in Embodiment 1, for example.

In general, the capacitance of a capacitor provided in a pixel portion of a display device is set in consideration of the leakage current or the like of transistors placed in the pixel portion so that charges can be held for a predetermined period. The capacitance of the capacitor may be set considering the off-state current of the transistor or the like.

FIG. 10 is an example of a liquid crystal display device using a transmissive liquid crystal element as a display element. In FIG. 10, a liquid crystal element 4013 that is a display element includes the first electrode layer 4030, a second electrode layer 4031, and a liquid crystal layer 4008. An insulating layer 4032 and an insulating layer 4033 that function as alignment films are provided to sandwich the liquid crystal layer 4008. The second electrode layer 4031 is provided on the second substrate 4006 side, and the first electrode layer 4030 and the second electrode layer 4031 overlap with each other with the liquid crystal layer 4008 therebetween. The transistor 4010 provided in the display portion 215 is electrically connected to the liquid crystal element 4013. That is, the transistor 4010 can be the transistor Tr1 described in Embodiment 1, and the liquid crystal element 4013 can be the liquid crystal element LC of the pixel PIX described in Embodiment 1, for example.

It is preferable to use a conductive material that transmits visible light for the first electrode layer 4030 and the second electrode layer 4031. As the conductive material, for example, a material containing one or more kinds selected from indium (In), zinc (Zn), and tin (Sn) can be used. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, zinc oxide containing gallium, and the like are given. Note that a film containing graphene can be used. The film containing graphene can be formed, for example, by reducing a film containing graphene oxide formed over a film.

The liquid crystal element 4013 can be a liquid crystal element using an FFS (fringe field switching) mode, for example. In addition, liquid crystal materials generally include a positive liquid crystal material with a positive dielectric anisotropy ($\Delta E$) and a negative liquid crystal material with a negative dielectric anisotropy. Both of the materials can be used for the liquid crystal element 4013 in this embodiment, and an optimal liquid crystal material can be selected according to the employed mode and design.

In the display device in this embodiment, a negative liquid crystal material is preferably used. The negative liquid crystal is less affected by a flexoelectric effect, which is attributed to the polarization of liquid crystal molecules, and thus the polarity causes little difference in transmittance. This prevents flickering from being recognized by the user of the display device. The flexoelectric effect is a phenomenon in which polarization is induced by the distortion of orientation, and mainly depends on the shape of a molecule. The negative liquid crystal material is less likely to experience the deformation such as spreading and bending.

Note that an element using an FFS mode is used as the liquid crystal element 4013 here; however, the liquid crystal element used is not limited to this, and a variety of modes can be used therefor. For example, a liquid crystal element using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used.

In addition, a normally-black liquid crystal display device such as a transmissive liquid crystal display device using a vertical alignment (VA) mode may be used in the display device in this embodiment. As the vertical alignment mode, an MVA (Multi-Domain Vertical Alignment) mode, a PVA (Patterned Vertical Alignment) mode, an ASV (Advanced Super View) mode, and the like, can be used.

Note that a liquid crystal element is an element that controls transmission and non-transmission of light by the optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer-dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although FIG. 10 illustrates an example of a display device including a liquid crystal element with a vertical electric field mode, a display device including a liquid crystal element with a horizontal electric field mode can be applied to one embodiment of the present invention. In the case of employing a horizontal electric field mode, a liquid crystal exhibiting a blue phase for which an alignment film is not used may be used. The blue phase is one of the liquid crystal phases, which appears immediately before a cholesteric phase changes into an isotropic phase when the temperature of a cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains a liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided to adjust a distance (cell gap) between the first electrode layer 4030 and the second electrode layer 4031. Note that a spherical spacer may be used.

Note that a black matrix (light-blocking layer), a coloring layer (color filter), an optical member (optical substrate) such as a polarizing member, a retardation member, or an anti-reflection member, and the like may be provided as appropriate. For example, circular polarization may be employed by using a polarizing substrate and a retardation substrate. In addition, a backlight unit, a side light unit, or the like may be used as a light source. A micro LED or the like may be used as the backlight unit or the side light unit. In the case of the display device illustrated in FIG. 10, for example, a polarizing substrate may be provided on each of the surface of the second substrate 4006 (the surface on the side opposite to the side where a coloring layer 4131 and a light-blocking layer 4132 are provided) and the rear surface of the first substrate 4001 (the surface on the side opposite to the side where the insulating layer 4102 is provided), and a backlight unit may be provided on the rear surface of the first substrate 4001 with the polarizing substrate therebetween (not illustrated).

In the display device shown in FIG. 10, the light-blocking layer 4132, the coloring layer 4131, and an insulating layer 4133 are provided between the second substrate 4006 and the second electrode layer 4031.

Examples of a material that can be used for the light-blocking layer 4132 include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer 4131 can also be used for the light-blocking layer 4132. For example, a stacked structure of a film containing a material used for a coloring layer 4131 that transmits light of a certain color and a film containing a material used for a coloring layer 4131 that transmits light of another color can be employed. The use of the same material for the coloring layer 4131 and the light-blocking layer 4132 is preferable, as the same apparatus can be used and the process can be simplified.

As a material that can be used for the coloring layer 4131, a metal material, a resin material, a resin material containing a pigment or dye, and the like, can be given. The light-blocking layer and the coloring layer may be formed by a method similar to the above-described methods for forming the layers. For example, an inkjet method may be used.

The insulating layer 4133 is preferably an overcoat having a planarization function. With the insulating layer 4133 having the planarization function, a flat insulating film can be formed over a formation surface of the coloring layer 4131 and the light-blocking layer 4132 each having a different thickness. Since the second electrode layer 4031 can be formed flat owing to the insulating layer 4133 being planarized, a thickness variation of the liquid crystal layer 4008 can be reduced. An acrylic resin or the like can be given as an example of such an insulating layer 4133.

In addition, the display device shown in FIG. 10 includes the insulating layer 4111 and an insulating layer 4102. As the insulating layer 4111 and the insulating layer 4102, insulating layers through which an impurity element does not easily pass are used. By sandwiching the transistors in between the insulating layer 4111 and the insulating layer 4102, entry of impurities into semiconductor layers from the outside can be prevented.

In addition, although the structure examples of the display device are described in this embodiment, a circuit structure, a circuit element, or the like may be changed as appropriate depending on circumstances. For example, since the transistor 4011 is easily destroyed by static electricity or the like, a protective circuit for protecting the driver circuit is preferably provided. The protective circuit is preferably formed using a nonlinear element.

Note that this embodiment can be combined with other embodiments and/or an example in this specification as appropriate.

Embodiment 3

In this embodiment, the structure of a transistor that can be used in a semiconductor device or a display device of one embodiment of the present invention will be described.

The semiconductor device or the display device of one embodiment of the present invention can be fabricated using a transistor with any of various structures, such as a bottom-gate transistor, a top-gate transistor, or the like. Therefore, a material for a semiconductor layer or the structure of a transistor can be easily changed depending on the existing production line.

[Bottom-Gate Transistor]

FIG. 11(A1) is a cross-sectional view of a channel-protective transistor 810, which is a bottom-gate transistor. In FIG. 11(A1), the transistor 810 is formed over a substrate 771. In addition, the transistor 810 includes an electrode 746 over the substrate 771 with an insulating layer 772 therebetween. In addition, the transistor 810 includes a semiconductor layer 742 over the electrode 746 with an insulating layer 726 therebetween. The electrode 746 can function as a gate electrode. The insulating layer 726 functions as a gate insulating layer.

In addition, an insulating layer 741 is provided over a channel formation region in the semiconductor layer 742. In addition, an electrode 744a and an electrode 744b are provided to be partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed during the formation of the electrode 744a and the electrode 744b. Thus, the channel formation region in the semiconductor layer 742 can be prevented from being etched during the formation of the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration increases in the regions of the semiconductor layer 742 where oxygen vacancies are generated, so that the regions become n-type regions ($n^+$ regions). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. Note that the insulating layer 729 can be omitted as needed.

A transistor 811 illustrated in FIG. 11(A2) is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is sandwiched between a gate electrode and the back gate electrode. Thus, the back gate electrode can function in a manner similar to that of the gate electrode. The potential of the back gate electrode may be the same as that of the gate electrode or may be a ground (GND) potential or a given potential. By changing the potential of the back gate electrode independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a top-gate transistor. One of the electrode 746 and the electrode 723 may be referred to as a "first gate electrode", and the other may be referred to as a "second gate electrode".

By providing the electrode 746 and the electrode 723 with the semiconductor layer 742 provided therebetween and setting the potentials of the electrode 746 and the electrode 723 to the same potential, a region of the semiconductor layer 742 through which carriers flow is enlarged in the film thickness direction; thus, the amount of transferred carriers is increased. As a result, the on-state current and the field-effect mobility of the transistor 811 increases.

Therefore, the transistor 811 is a transistor that has a high on-state current with respect to its occupied area. That is, the area occupied by transistor 811 can be small for a required on-state current. According to one embodiment of the present invention, the area of a transistor can be reduced. Therefore, according to one embodiment of the present invention, a semiconductor device having a high degree of integration can be provided.

In addition, the gate electrode and the back gate electrode, being formed using conductive layers, have a function of preventing an electric field generated outside the transistor from influencing the semiconductor layer in which the channel formation region is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

A cross-sectional view of a channel-protective transistor 820 that is a bottom-gate transistor is shown in FIG. 11(B1). The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744a through an opening formed by selectively removing part of the insulating layer 741 which overlaps with the semiconductor layer 742. In addition, the semiconductor layer 742 is electrically connected to the electrode 744b through another opening formed by selectively removing part of the insulating layer 741 which overlaps with the semiconductor layer 742. A region of the insulating layer 741 which overlaps with the channel formation region can function as a channel protective layer.

A transistor 821 illustrated in FIG. 11(B2) is different from the transistor 820 in that the electrode 723 which can function as a back gate electrode is provided over the insulating layer 729.

With the insulating layer 741, the semiconductor layer 742 can be prevented from being exposed during the formation of the electrode 744a and the electrode 744b. Thus, thinning of the semiconductor layer 742 during the formation of the electrode 744a and the electrode 744b can be prevented.

In addition, the length between the electrode 744a and the electrode 746 and the length between the electrode 744b and the electrode 746 in the transistor 820 and the transistor 821 are larger than those in the transistors 810 and 811. Thus, the parasitic capacitance generated between the electrode 744a and the electrode 746 can be reduced. In addition, the parasitic capacitance generated between the electrode 744b and the electrode 746 can also be reduced. According to one embodiment of the present invention, a transistor with favorable electrical characteristics can be provided.

A transistor 825 illustrated in FIG. 11(C1) is a channel-etched transistor that is a bottom-gate transistor. In the transistor 825, the electrode 744a and the electrode 744b are formed without providing the insulating layer 741. Thus, part of the semiconductor layer 742 that is exposed at the time of forming the electrode 744a and the electrode 744b is etched in some cases. However, since the insulating layer 741 is not provided, the transistor can be manufactured with improved productivity.

A transistor 826 illustrated in FIG. 11(C2) is different from the transistor 825 in that the electrode 723 which can function as a back gate electrode is provided over the insulating layer 729.

[Top-Gate Transistor]

A transistor 842 illustrated in FIG. 12(A1) is a top-gate transistor. The transistor 842 is different from the transistors 810, 811, 820, 821, 825, and 826 in that the electrode 744a and the electrode 744b are formed after the insulating layer 729 is formed. The electrode 744a and the electrode 744b are electrically connected to the semiconductor layer 742 through openings formed in the insulating layer 728 and the insulating layer 729.

Furthermore, by removing part of the insulating layer 726 that does not overlap with the electrode 746 and introducing an impurity 755 into the semiconductor layer 742 using the electrode 746 and the residual insulating layer 726 as a mask, an impurity region can be formed in the semiconductor layer 742 in a self-aligned manner. The transistor 842 includes a region where the insulating layer 726 extends beyond end portions of the electrode 746. The impurity concentration of the semiconductor layer 742 in a region into which the impurity 755 is introduced through the insulating layer 726 is lower than that of the semiconductor layer 742 in a region into which the impurity 755 is introduced not through the insulating layer 726. Thus, an LDD (Lightly Doped Drain) region is formed in a region of the semiconductor layer 742 which does not overlap with the electrode 746.

A transistor 843 illustrated in FIG. 12(A2) is different from the transistor 842 in that the electrode 723 is included. The transistor 843 includes the electrode 723 which is formed over the substrate 771. The electrode 723 includes a region that overlaps with the semiconductor layer 742 with the insulating layer 772 therebetween. The electrode 723 can function as a back gate electrode.

In addition, as in a transistor 845 illustrated in FIG. 12(B1) and a transistor 844 illustrated in FIG. 12(B2), the insulating layer 726 in a region that does not overlap with the electrode 746 may be completely removed. Alternatively, as in a transistor 846 illustrated in FIG. 12(C1) and a transistor 847 illustrated in FIG. 12(C2), the insulating layer 726 may be left remaining.

In the transistor 842 to the transistor 847, after the formation of the electrode 746, by introducing the impurity 755 into the semiconductor layer 742 using the electrode 746 as a mask, an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

Note that this embodiment can be combined with other embodiments and/or an example in this specification as appropriate.

Embodiment 4

In this embodiment, the compositions of a CAC-OS (cloud-aligned composite oxide semiconductor) and a CAAC-OS (c-axis-aligned crystalline oxide semiconductor) which are metal oxides that can be used in the OS transistor described in the above embodiment will be described. Note that in this specification and the like, CAC refers to an example of a function or a material composition and CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. In addition, in some cases, the conductive regions and the insulating regions in the material are separated at the nanoparticle level. In addition, in some cases, the conductive regions and the insulating regions are unevenly distributed in the material. In addition, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

An oxide semiconductor is classified into a single crystal oxide semiconductor and a non-single crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

The CAAC-OS tends to have a layered crystal structure (also referred to as layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is an oxide semiconductor with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might cause a decrease in the crystallinity of an oxide semiconductor, which means that the CAAC-OS is an oxide semiconductor having few impurities and defects (e.g., oxygen vacancies).

Thus, an oxide semiconductor including a CAAC-OS is physically stable. Therefore, the oxide semiconductor including a CAAC-OS is resistant to heat and has high reliability. In addition, the CAAC-OS is stable with respect to high temperatures in the manufacturing process (known as thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation across the entire film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, a transistor with high field-effect mobility can be achieved. In addition, the transistor having high reliability can be achieved.

An oxide semiconductor with a low carrier density is preferably used for a transistor. In the case where the carrier density of an oxide semiconductor film is lowered, the impurity concentration in the oxide semiconductor film is lowered to lower the density of defect states. In this specification and the like, a state with a low impurity concentration and a low density of defect states is referred to as a highly purified intrinsic or substantially highly purified intrinsic state. For example, the carrier density of the oxide semiconductor is lower than $8\times10^{11}/cm^3$, preferably lower than $1\times10^{11}/cm^3$, more preferably lower than $1\times10^{10}/cm^3$, and greater than or equal to $1\times10^{-9}/cm^3$.

In addition, a highly purified intrinsic or substantially highly purified intrinsic oxide semiconductor film has a low density of defect states and accordingly has a low density of trap states in some cases.

Furthermore, charges trapped by the trap states in the oxide semiconductor take a long time to disappear and may behave like fixed charges. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferred that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferred to reduce the concentration of an alkali metal or an alkaline earth metal in the oxide semiconductor. Specifically, the concentration of an alkali metal or an alkaline earth metal in the oxide semiconductor obtained by SIMS is set lower than or equal to $1\times10^{18}$ atoms/cm$^3$, preferably lower than or equal to $2\times10^{16}$ atoms/cm$^3$.

Furthermore, when containing nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor obtained by SIMS is set, for example, lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, and still more preferably lower than or equal to $5\times10^{17}$ atoms/cm$^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, more preferably lower than $5\times10^{18}$ atoms/cm$^3$, and still more preferably lower than $1\times10^{18}$ atoms/cm$^3$.

When an oxide semiconductor with sufficiently reduced impurities is used for a channel formation region of a transistor, stable electrical characteristics can be given.

This embodiment can be combined with any of the other embodiments and/or an example as appropriate.

Embodiment 5

In this embodiment, examples of a product in which the semiconductor device or the display device described in the above embodiments is used for an electronic device will be described.

<Laptop Personal Computer>

Figure 13A:
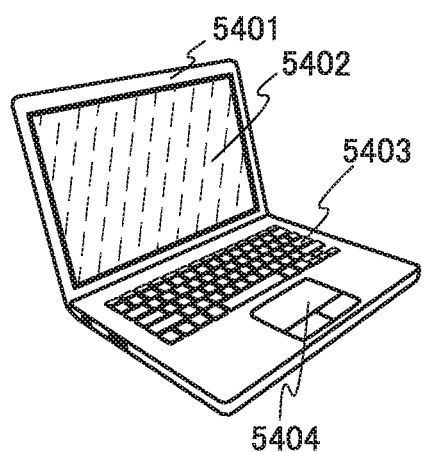
FIGS. 13A-13F Perspective views illustrating examples of an electronic device.

The semiconductor device or the display device of one embodiment of the present invention can be used for a display provided in an information terminal device. FIG. 13(A) is a laptop personal computer, which is an information terminal device, and includes a housing 5401, a display portion 5402, a keyboard 5403, a pointing device 5404, and the like.

<Smartwatch>

Figure 13B:
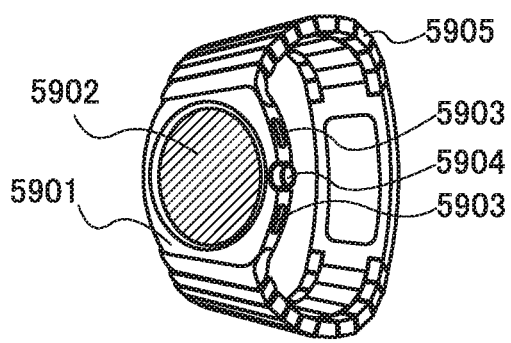

The semiconductor device or the display device of one embodiment of the present invention can be used for a wearable terminal. FIG. 13(B) is a smartwatch, which is a wearable terminal, and includes a housing 5901, a display portion 5902, an operation button 5903, an operator 5904, a band 5905, and the like. In addition, a display device with a function of a position input device may be used for the display portion 5902. In addition, the function of the position input device can be added by provision of a touch panel in a display device. Alternatively, the function of the position input device can be added by provision of a photoelectric conversion element called a photosensor in a pixel portion of a display device. In addition, as the operation buttons 5903, any of a power switch for activating the smartwatch, a button for operating an application of the smartwatch, a volume control button, a switch for turning on or off the display portion 5902, and the like can be provided. In addition, although the number of the operation buttons 5903 is two in the smartwatch illustrated in FIG. 13(B), the number of the operational buttons of the smartwatch is not limited thereto. In addition, the operator 5904 functions as a crown used for setting the time on the smartwatch. In addition, the operator 5904 may be used as an input interface for operating an application of the smartwatch as well as the crown for time adjustment. Note that although the smartwatch illustrated in FIG. 13(B) has a structure with the operator 5904, without being limited thereto, a structure without the operator 5904 may be used.

<Video Camera>

Figure 13C:
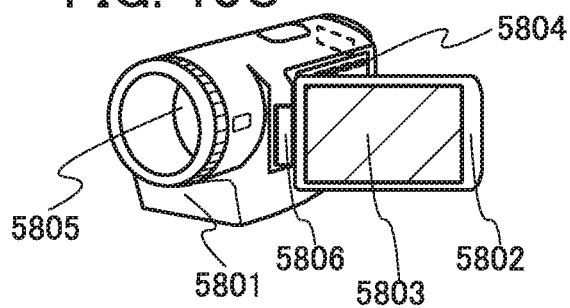

The semiconductor device or the display device of one embodiment of the present invention can be used for a video camera. The video camera in FIG. 13(C) includes a first housing 5801, a second housing 5802, a display portion 5803, operation keys 5804, a lens 5805, a joint portion 5806, and the like. The operation keys 5804 and the lens 5805 are provided in the first housing 5801, and the display portion 5803 is provided in the second housing 5802. Furthermore, the first housing 5801 and the second housing 5802 are connected to each other with the joint portion 5806, and the angle between the first housing 5801 and the second housing 5802 can be changed with the joint portion 5806. A structure in which images on the display portion 5803 are changed in accordance with the angle at the joint portion 5806 between the first housing 5801 and the second housing 5802 may be employed.

<Mobile Phone>

Figure 13D:
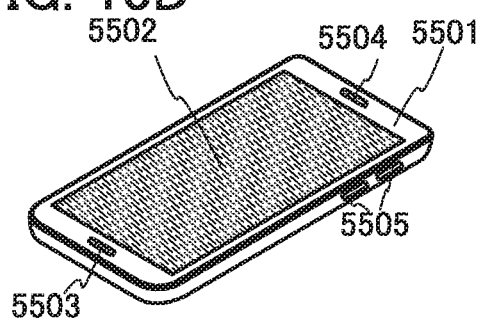

The semiconductor device or the display device of one embodiment of the present invention can be used for a mobile phone. FIG. 13(D) is a mobile phone having a function of an information terminal, which includes a housing 5501, a display portion 5502, a microphone 5503, a speaker 5504, and an operation button 5505. A display device with a function of a position input device may be used for the display portion 5502. The function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the mobile phone in FIG. 13(D) includes two operation buttons 5505, the number of the operation buttons included in the mobile phone is not limited thereto. Although not illustrated, the mobile phone illustrated in FIG. 13(D) may include a light-emitting device for use as a flash light or a lighting device.

<Television Device>

Figure 13E:
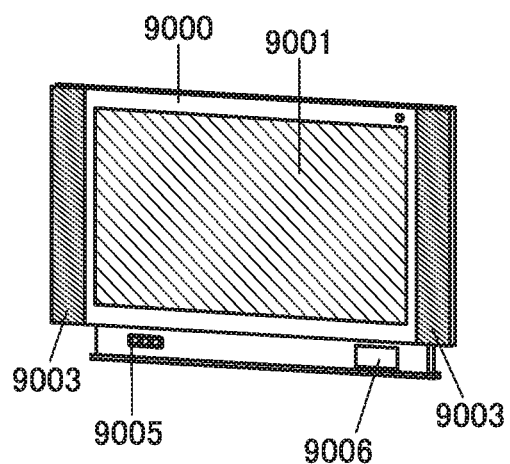

The semiconductor device or the display device of one embodiment of the present invention can be provided in a television device. A television device illustrated in FIG. 13(E) includes a housing 9000, a display portion 9001, a speaker 9003, an operation key 9005 (including a power switch or an operation switch), a connection terminal 9006, and the like. The television device can include the display portion 9001 having a large screen size of, for example, 50 inches or more, or 100 inches or more.

<Vehicle>

The semiconductor device or the display device of one embodiment of the present invention can also be used around a driver's seat in a car, which is a vehicle.

Figure 13F:
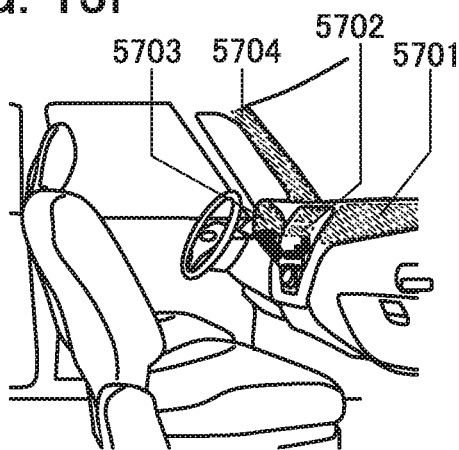

FIG. 13(F) is a figure that illustrates a windshield and its vicinity inside an automobile, for example. In FIG. 13(F), a display panel 5701, a display panel 5702, and a display panel 5703 attached to a dashboard, and a display panel 5704 attached to a pillar are illustrated.

The display panel 5701 to the display panel 5703 can display a variety of information such as navigation information, a speedometer, a tachometer, a mileage, a fuel meter, a gearshift state, and air-conditioner settings. In addition, the display content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car body leads to elimination of blind areas and enhancement of safety. In addition, showing an image that compensates for the areas which cannot be seen makes it possible to confirm safety more easily and comfortably. The display panel 5704 can also be used as a lighting device.

<Electronic Device for Electronic Advertisement>

Figure 14A:
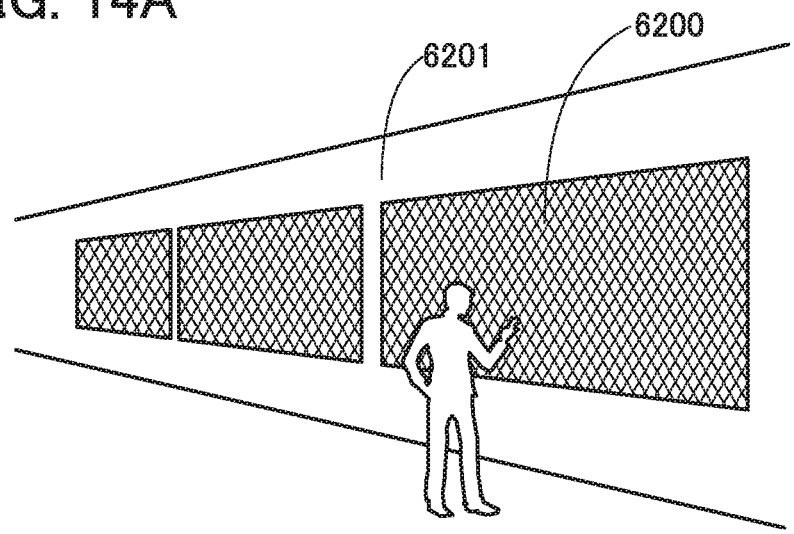
FIGS. 14A-14B Perspective views illustrating examples of an electronic device.

The semiconductor device or the display device of one embodiment of the present invention can be used for a display used for an electronic advertisement. FIG. 14(A) shows an example of digital signage that can be attached to a wall. FIG. 14(A) illustrates how a digital signage 6200 is attached to a wall 6201.

<Foldable Tablet Information Terminal>

Figure 14B:
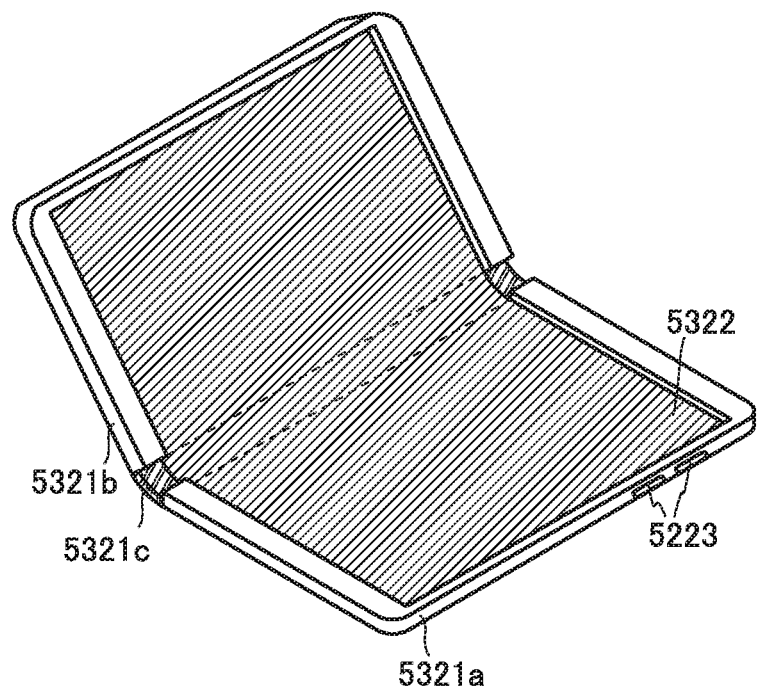

The semiconductor device or the display device of one embodiment of the present invention can be used for a tablet information terminal. FIG. 14(B) illustrates a tablet information terminal with a structure that can be folded. The information terminal in FIG. 14(B) includes a housing 5321a, a housing 5321b, a display portion 5322, and an operation button 5323. In particular, the display portion 5322 includes a flexible base, and the base enables a structure that can be folded.

The housing 5321a and the housing 5321b are connected to each other with a hinge portion 5321c that allows a bi-fold. In addition, the display portion 5322 is provided to the housing 5321a, the housing 5321b, and the hinge portion 5321c.

Although not illustrated, the electronic devices illustrated in FIGS. 13(A) to 13(C) and 13(E), and FIGS. 14(A) to 14(B) can each have a structure that includes a microphone and a speaker. With this structure, the above electronic devices can have an audio input function, for example.

In addition, although not illustrated, each of the electronic devices illustrated in FIGS. 13(A), 13(B), and 13(D), and FIGS. 14(A), and 14(B) may have a structure that includes a camera.

In addition, the electronic devices illustrated in FIGS. 13(A) to 13(F) and FIGS. 14(A) and 14(B) may have, although not illustrated, a structure provided with a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) in the housing. In particular, by providing a detection device including a sensor for detecting tilt, such as a gyroscope sensor or an acceleration sensor, for the mobile phone illustrated in FIG. 13(D), the direction of the mobile phone (which direction the mobile phone faces in, with respect to the vertical direction) is determined, so that display on the display portion 5502 can be automatically changed in accordance with the direction of the mobile phone.

In addition, although not illustrated, the electronic devices illustrated in FIGS. 13(A) to 13(F) and FIGS. 14(A) and 14(B) may have a structure that includes a device for obtaining biological information such as fingerprints, veins, iris, or voice prints. Employing this structure can achieve an electronic device having a biometric identification function.

Furthermore, as a display portion of the electronic devices illustrated in FIGS. 13(A) to 13(F) and FIG. 14(A), a flexible base may be used. Specifically, the display portion may have a structure in which a transistor, a capacitor, a display element, and the like are provided over a flexible base. With such a structure, in addition to the electronic device having the housing with a flat surface as illustrated in FIGS. 13(A) to 13(F) and FIG. 14(A), an electronic device having a housing with a curved surface like the dashboard and the pillar illustrated in FIG. 13(F) can be enabled.

As a flexible base that can be used for the display portions in FIGS. 13(A) to 13(F) and FIGS. 14(A) and 14(B), any of the following materials that transmit visible light can be used: a poly(ethylene terephthalate) resin (PET), a poly (ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, and the like. Alternatively, a mixture or a stack including any of these materials may be used.

Note that this embodiment can be combined with other embodiments and/or an example in this specification as appropriate.

Embodiment 6

In this embodiment, a semiconductor device that can be used in the electronic device described in the above embodiment is described. The semiconductor device described below as an example can function as a memory device.

In this embodiment, a DOSRAM (registered trademark) will be described as an example of a memory device using an oxide semiconductor. Note that the name "DOSRAM" stands for a Dynamic Oxide Semiconductor Random Access Memory. A DOSRAM refers to a memory device including a 1T1C (one transistor and one capacitor) memory cell where an oxide semiconductor is used for a write transistor.

A stacked structure example of a DOSRAM 1000 will be described using FIG. 15. In the DOSRAM 1000, a sense amplifier portion 1002 that performs data read and a cell array portion 1003 that stores data are stacked.

Figure 15:
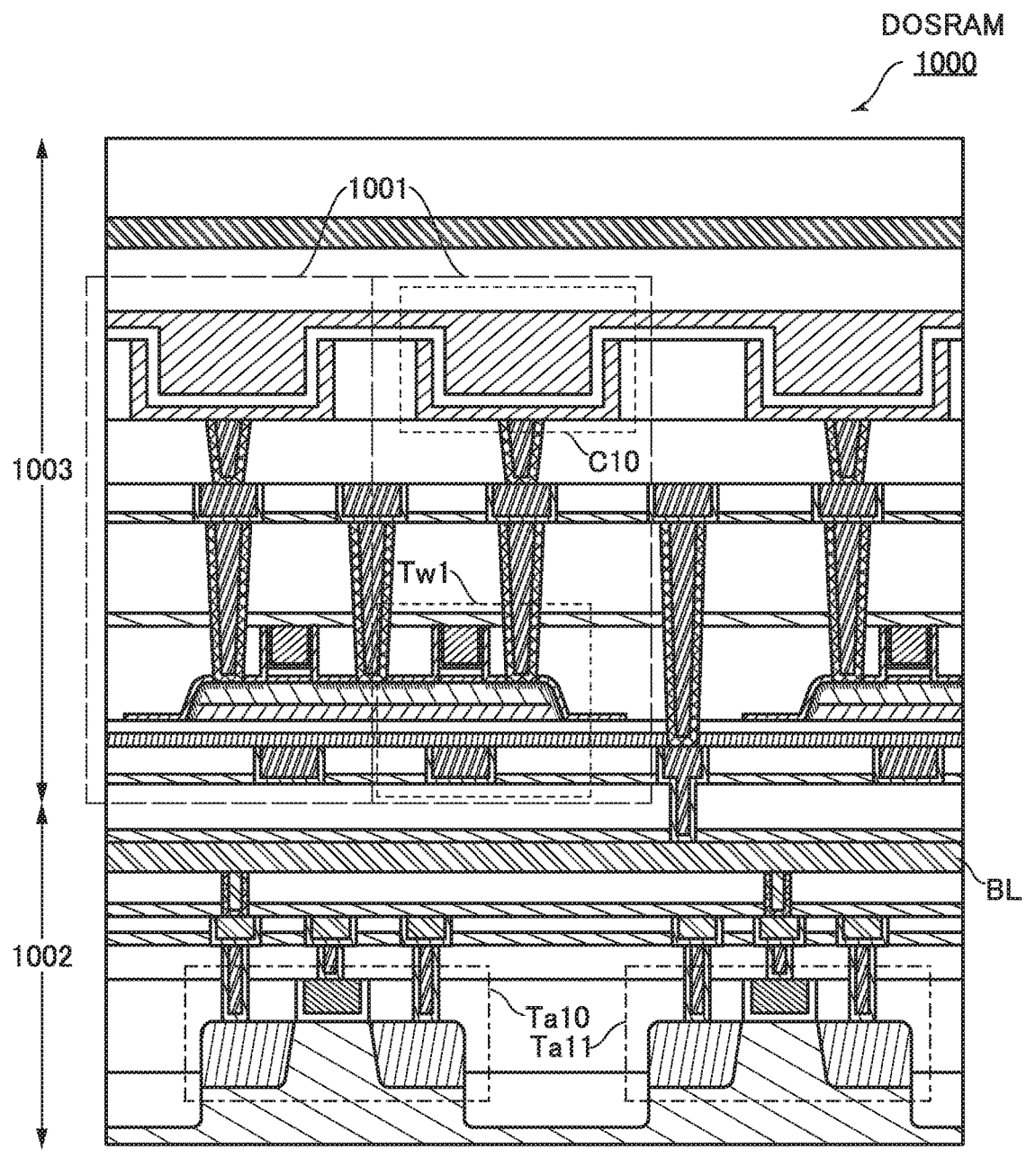
FIG. 15 A cross-sectional view illustrating a structure example of a DOSRAM.

As illustrated in FIG. 15, the sense amplifier portion 1002 includes a bit line BL and Si transistors Ta10 and Ta11. The Si transistors Ta10 and Ta11 include a semiconductor layer in a single crystal silicon wafer. The Si transistors Ta10 and Ta11 are included in the sense amplifier and electrically connected to the bit line BL.

The cell array portion 1003 includes a plurality of memory cells 1001. The memory cell 1001 includes a transistor Tw1 and a capacitor C10. In the cell array portion 1003, two transistors Tw1 share a semiconductor layer. The semiconductor layer and the bit line BL are electrically connected to each other through a conductor that is not illustrated.

A stacked structure such as that illustrated in FIG. 15 can be used for a variety of semiconductor devices formed by stacking a plurality of circuits each including a transistor group.

Metal oxides, insulators, conductors, and the like in FIG. 15 have either a single-layer structure or a stacked structure. They can be formed by any of a variety of deposition methods such as a sputtering method, a molecular beam epitaxy (MBE) method, a pulsed laser ablation (PLA) method, a CVD method, and an atomic layer deposition (ALD) method. Examples of the CVD method include a plasma CVD method, a thermal CVD method, and a metal organic CVD method.

Here, the semiconductor layer of the transistor Tw1 is formed using a metal oxide (oxide semiconductor). Here, an example in which the semiconductor layer is formed of three metal oxide layers is shown. The semiconductor layer is preferably formed using a metal oxide containing In, Ga, and Zn.

When an element that forms oxygen vacancies or an element that is bonded to oxygen vacancies is added to the metal oxide, the metal oxide may have increased carrier density and thus have reduced resistance. For example, by selectively reducing the resistance of the semiconductor layer formed using the metal oxide, a source region or a drain region can be provided in the semiconductor layer.

As the element that reduces the resistance of the metal oxide, boron or phosphorus is typically used. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element can be measured by secondary ion mass spectrometry (SIMS) or the like.

In particular, boron and phosphorus are preferably used because an apparatus used in a manufacturing line for amorphous silicon or low-temperature polysilicon can be used. Using the apparatus in the manufacturing line can reduce capital investment.

The transistor including the semiconductor layer whose resistance is selectively reduced can be formed using a dummy gate, for example. Specifically, the dummy gate is preferably provided over the semiconductor layer, and an element that reduces the resistance of the semiconductor layer is preferably added to the semiconductor layer using the dummy gate as a mask. That is, the element is added to a region of the semiconductor layer that does not overlap with the dummy gate, so that a low-resistance region is formed. For the addition of the element, an ion implantation method by which an ionized source gas is subjected to mass separation and then added, an ion doping method by which an ionized source gas is added without mass separation, a plasma immersion ion implantation method, or the like can be used.

Examples of a conductive material used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). In addition, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

Examples of an insulating material used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound that contains more oxygen than nitrogen, and a nitride oxide refers to a compound that contains more nitrogen than oxygen.

Note that this embodiment can be combined with other embodiments and/or an example in this specification as appropriate.

Example

A calculation was run using a circuit simulator to check whether the correction of image data was properly performed in the operation of the display device described in Embodiment 1. This example describes the calculation and its results.

The software used in the calculation is the circuit simulator SmartSpice (version 4.26.7.R) produced by Silvaco, Inc. The circuit simulator was used to run the calculation with the image data and the correction data specified as input data, and the corrected image data specified as output data.

Figure 16:
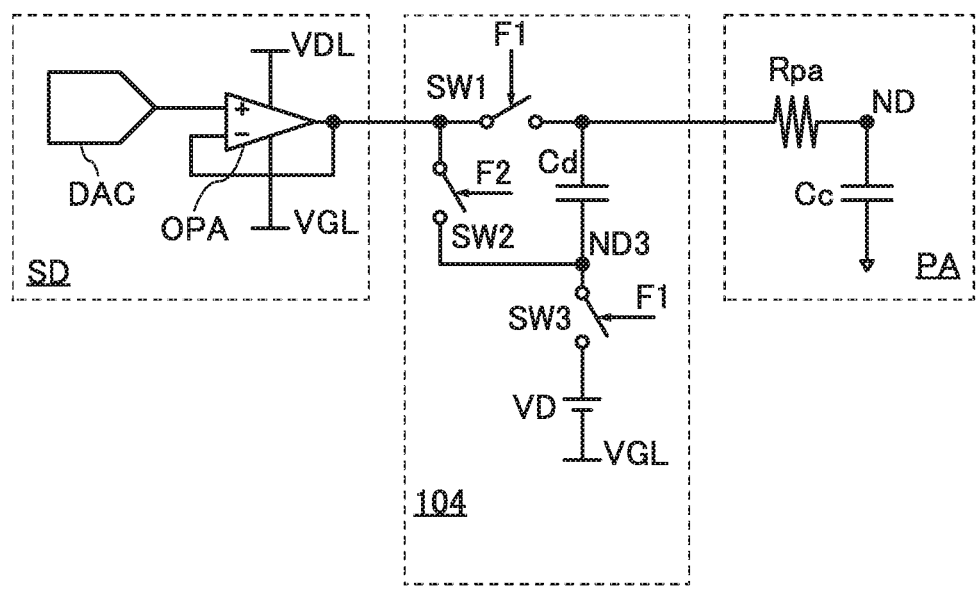
FIG. 16 A circuit diagram of a display device in Example.

FIG. 16 illustrates a circuit structure used for this calculation. In FIG. 16, the source driver circuit SD, the correction data storage portion 104, and the display portion PA are illustrated.

Only the digital-analog converter circuit DAC and an operational amplifier OPA are illustrated in the source driver circuit SD in FIG. 16. The operational amplifier OPA is a CMOS circuit configured with Si transistors, and corresponds to the amplifier circuit AMP in FIG. 1.

An output terminal of the digital-analog converter circuit DAC is electrically connected to a non-inverting input terminal of the operational amplifier OPA. The non-inverting input terminal of the operational amplifier OPA is electrically connected to an output terminal of the operational amplifier OPA, and the output terminal of the operational amplifier OPA is electrically connected to the second terminal of the switch SW1 in the correction data storage portion 104 and the first terminal of the switch SW2. Note that the operational amplifier OPA functions as a voltage circuit owing to the above connection.

In addition, a high-power-input terminal of the operational amplifier OPA is electrically connected to a wiring VDL, and a low-power-input terminal of the operational amplifier OPA is electrically connected to a wiring VGL.

For the correction data storage portion 104, the description of the correction data storage portion 104 in FIG. 3 in Embodiment 1 can be referred to.

Note that in the description of Embodiment 1, the second terminal of the switch SW3 is described as being electrically connected to the wiring VG; however, in the correction data storage portion 104 in FIG. 16, the second terminal of the switch SW3 is electrically connected to the wiring VGL through a direct-current power source VD. In addition, each of the switch SW1 to the switch SW3 uses an analog switch (a switch with structure of a CMOS circuit) as a switching element.

In the display portion PA in FIG. 16, a resistor Rpa that represents the resistance of the wiring SL (the wiring DL), and a capacitor Cc that represents a combined capacitance of the parasitic capacitance of the wiring SL (wiring DL) and the capacitance of the capacitor C1 of the pixel PIX, are illustrated. The point of electrical connection between the resistor Rpa and the capacitor Cc is referred to as a node ND.

Next, calculation conditions are described. The capacitance value of the capacitor Cd of the correction data storage portion 104 is set as 1 pF and the capacitance value of the capacitor Cc is set as 31 pF. This corresponds to a specific example of the Embodiment 1, where the voltage output from the digital-analog converter circuit DAC is interpolated with a voltage corresponding to low-order 5 bits.

In addition, the voltage of the direct-current power source VD is set as 0.5 V.

In addition, the value of the resistor Rpa is set as 10 kΩ.

The digital-analog converter circuit DAC is set to output a potential in the range of 0.5 V to 8.5 V in 0.25 V steps.

Since the operational amplifier OPA has the structure of a voltage follower circuit, the operational amplifier OPA must be a circuit that can handle the range of potentials that can be output from the digital-analog converter circuit DAC. Therefore, a potential supplied by the wiring VDL that is electrically connected to the high-power-input terminal of the operational amplifier OPA is set at 9 V, and a potential supplied by the wiring VGL that is electrically connected to the low-power-input terminal of the operational amplifier OPA is set at a reference potential.

Figure 17:
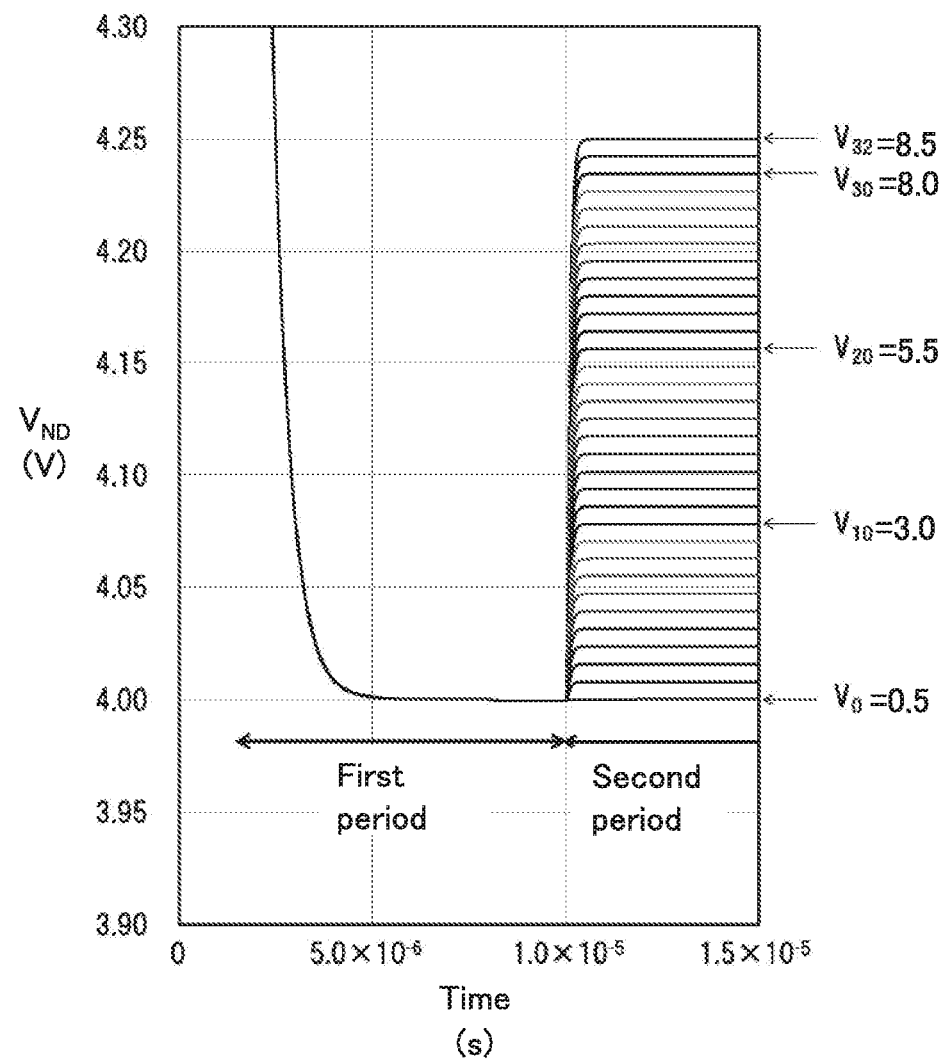
FIG. 17 A diagram showing the potential changes corresponding to image data by a potential corresponding to correction data being written in the display device in FIG. 16.

The graph in FIG. 17 shows changes in the correction data that is output from the digital-analog converter circuit DAC and the potential of the node ND during the first period and the second period. Specifically, in FIG. 17 shows the vertical axis representing a potential $V_{ND}$ of the node ND, and the horizontal axis representing the time. In the operation example of Embodiment 1, each of the first period and the second period is set as a period between Time T1 and Time T2 and a period between Time T2 to Time T4, respectively. Specifically, Time T1 is assumed as 0 s (the point at which the calculation starts) in FIG. 17, and Time T2 is assumed as $1.0 \times 10^{-5}$ s (the time at which image data write is complete).

In the first period, an operation is performed in which the switch SW1 and the switch SW3 are brought into an on state with the signal F1, the switch SW2 is brought into an off state with the signal F2, 4.0 V is output from the digital-to-analog converter circuit DAC as a potential corresponding to image data, and the potential is written to the node ND.

In the second period, an operation is performed in which the switch SW1 and the switch SW3 are brought into an off state with the signal F1, the switch SW2 is brought into an on state with the signal F2, one potential of those in 0.25 V steps from 0.5 V to 8.5 V is output from the digital-analog converter circuit DAC as correction data, and the output potential is written to the node ND3. With the potential corresponding to the correction data being written to the node ND3, the potential $V_{ND}$ changes. Note that in this example, the potentials in 0.25 V steps from 0.5 V to 8.5 V are denoted as $V_0$ to $V_{32}$ as potentials corresponding to the correction data, and only the reference numerals of $V_0$, $V_{10}$, $V_{20}$, $V_{30}$, and $V_{32}$ are shown in FIG. 17.

Here, the case where $V_0$ (0.5 V) is written as the correction data to the node ND3 in the second period is considered. Since the potential of the node ND3 is 0.5 V in the first period, the potential of the node ND3 does not change from 0.5 V even after the transition from the first period to the second period. Thus, the potential $V_{ND}$ does not change through capacitive coupling of the capacitor Cd, and remains at 4.0 V.

Next, a case where $V_{10}$ (3.0 V) is written as the correction data to the node ND3 in the second period is considered. Since the potential of the node ND3 was 0.5 V in the first period, the potential of the node ND3 increases by 2.5 V by a transition to the second period. Here, the potential of the potential $V_{ND}$ can be estimated as $4+2.5/32$ V ($=4.078125$ V) from Formula (E2), which substantially agrees with the results in FIG. 17.

Similarly, in the second period, the case where each of $V_{20}$ (5.5 V), $V_{30}$ (8.0 V), and $V_{32}$ (8.5 V) is written to the node ND3 as the correction data is considered. Since the potential of the node ND3 was 0.5 V in the first period, the potential of the node ND3 increases by 5.0 V, 7.5 V, and 8.0 V in each case by a transition to the second period. Here, the potential of the potential $V_{ND}$ can be estimated as $4+5.0/32$ V ($=4.15625$ V), $4+7.5/32$ V ($=4.234375$ V) and $4+8.0/32$ V ($=4.25$ V) in each case, which substantially agrees with the results in FIG. 17.

As described above, the digital-analog converter circuit DAC outputs the potential in 0.25 V steps, and the correction data storage portion 104, can generate potentials with a step range smaller than 0.25 V.

In other words, with the use of the display device of one embodiment of the present invention, image data having a higher resolving power than that of the digital-analog converter circuit DAC included in the source driver circuit SD can be generated by the correction data storage portion. In addition, by writing the image data to a pixel included in the display device, a display portion of the display device can display an image with many gradations.

(Notes on the Description in this Specification and the Like)

The following are notes on the description of structures in the embodiments and example in this specification.

<Notes on One Embodiment of the Present Invention Described in Embodiments and Example>

One embodiment of the present invention can be constituted by appropriately combining the structure described in each embodiment and example with any of the structures described in the other embodiments. In addition, in the case where a plurality of structure examples are described in one embodiment, the structure examples can be combined as appropriate Note that what is described (or part thereof) in one embodiment or example can be applied to, combined with, or replaced with at least one of another content (or part thereof) in the embodiment or example and what is described (or part thereof) in another embodiment or other embodiments.

Note that in each embodiment or example, a content described in the embodiment or example is a content described with reference to a variety of diagrams or a content described with text in the specification.

Note that by combining a diagram (or part thereof) described in one embodiment or one example with at least one of another part of the diagram, a different diagram (or part thereof) described in the embodiment or example, and a diagram (or part thereof) described in another embodiment, other embodiments, or an example, much more diagrams can be formed.

<Notes on Ordinal Numbers>

Ordinal numbers such as "first," "second," and "third" in this specification and the like are used in order to avoid confusion among components. Thus, the terms do not limit the number of components. In addition, the terms do not limit the order of components. In this specification and the like, for example, a "first" component in one embodiment (or example) can be referred to as a "second" component in other embodiments (or example) or claims. Furthermore, in this specification and the like, for example, a "first" component in one embodiment (or example) can be omitted in other embodiments or claims.

<Notes on Description for Drawings>

Embodiments (or example) are described with reference to drawings. However, the embodiments (or example) can be implemented with various different modes. It is readily understood by those skilled in the art that modes and details can be changed in various ways without departing from the spirit and scope of the present invention. Thus, the present invention should not be interpreted as being limited to the description of the embodiments (or example). Note that in the structures of the invention in the embodiments (the structure in the example), the same portions or portions having similar functions are denoted by the same reference numerals in different drawings, and a repetitive description of such portions is omitted.

In this specification and the like, the terms for explaining arrangement, such as "over" and "under", are used for convenience to describe the positional relation between components with reference to drawings. The positional relation between components is changed as appropriate in accordance with a direction in which the components are described. Thus, terms for describing arrangement are not limited to those described in this specification and the like and can be rephrased as appropriate according to circumstances. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

<Notes on Expressions that can be Rephrased>

In this specification and the like, expressions "one of a source and a drain" (or a first electrode or a first terminal) and "the other of the source and the drain" (or a second electrode or a second terminal) are used in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Note that in this specification and the like, a channel formation region refers to a region where a channel is formed; this region is formed by application of a potential to the gate, so that current can flow between the source and the drain.

Furthermore, functions of a source and a drain might be switched when a transistor of opposite polarity is employed or a direction of current flow is changed in circuit operation, for example. Thus, the terms of source and drain are interchangeably used in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. The voltage refers to a potential difference from a reference potential. When the reference potential is a ground potential, for example, the voltage can be expressed as the potential. The ground potential does not necessarily mean 0 V. Potentials are relative values, and the potential applied to a wiring or the like is changed depending on the reference potential, in some cases.

Note that in this specification and the like, the terms "film," "layer," and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring," "signal line," "power source line," and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line," "power source line," or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

<Notes on Definitions of Terms>

Definitions of the terms that are mentioned in the above embodiments and example are described below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies may be formed by entry of impurities such as hydrogen. Furthermore, when the semiconductor is a silicon layer, examples of an impurity that changes the characteristics of the semiconductor include oxygen, Group 1 elements except hydrogen, Group 2 elements, Group 13 elements, and Group 15 elements.

<<Switch>>

In this specification and the like, a switch is in a conduction state (on state) or in a non-conduction state (off state) to determine whether current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, the switch has a function of being in a conduction state (on state) or a non-conduction state (off state) to determine whether current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are regarded as being functionally connected when a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected."

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Note that these expressions are examples and expressions are not limited to these expressions. When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

REFERENCE NUMERALS

DD: display device, DD1: display device, DD2: display device, DD3: display device, PA: display portion, GD: gate driver circuit, SD: source driver circuit, PIX: pixel, SR: shift register, LAT: latch circuit, LVS: level shift circuit, DAC: digital-analog converter circuit, AMP: amplifier circuit, GL: wiring, GL1: wiring, GL2: wiring, SL: wiring, VA: wiring, VC: wiring, VP: wiring, VG: wiring, DL: wiring, AL: wiring, VL: wiring, VCOM: wiring, CAT: wiring, CRL1: wiring, CRL2: wiring, DB: data bus wiring, Rp: resistor, Cs: capacitor, Cp: capacitor, Cpa: capacitor, Cd: capacitor, C1: capacitor, C2: capacitor, Tr1: transistor, Tr2: transistor, Tr3: transistor, Tr4: transistor, Try: transistor, SWT1: transistor, SWT2: transistor, SWT3: transistor, SWC: switch, SW1: switch, SW2: switch, SW3: switch, LC: liquid crystal element, LD: light-emitting element, ND1: node, ND2: node, ND3: node, VDL: wiring, VGL: wiring, Rpa: resistor, Cc: capacitor, ND: node, BL: bit line, Ta10: Si transistor, Ta11: Si transistor, Tw1: transistor, C10: capacitor, 101: image data storage portion, 102: driver circuit portion, 103: display element, 104: correction data storage portion, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 1000: DOSRAM, 1001: memory cell, 1002: sense amplifier portion, 1003: cell array portion, 4001: first substrate, 4005: sealant, 4006: second substrate, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: first electrode layer, 4031: second electrode layer, 4032: insulating layer, 4033: insulating layer, 4035: spacer, 4041: print board, 4042: integrated circuit, 4102: insulating layer, 4103, insulating layer, 4110: insulating layer, 4111: insulating layer, 4112: insulating layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 5321a: housing, 5321b: housing, 5321c: hinge portion, 5322: display portion, 5323: operation button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint portion, 5901: housing, 5902: display portion, 5903: operation button, 5904: operator, 5905: band, 6200: digital signage, 6201: wall, 9000: housing, 9001: display portion, 9003: speaker, 9005: operation key, 9006: connection terminal.

The invention claimed is:

1. A display device comprising:
a first circuit;
a second circuit; and
an image signal line,
wherein the first circuit comprises an image data storage portion and a display element,
wherein the second circuit comprises a correction data storage portion,
wherein the second circuit is electrically connected to the image signal line,
wherein the image signal line is electrically connected to the first circuit,
wherein the image data storage portion is electrically connected to the display element,
wherein the first circuit is configured to store first image data in the image data storage portion,
wherein the second circuit is configured to:
store correction data in the correction data storage portion; and
correct the first image data stored in the image data storage portion according to the correction data to obtain second image data,
wherein the display element is configured to display an image corresponding to the second image data,
wherein the second circuit comprises a first switch, a second switch, a third switch and a first capacitor,
wherein the first circuit comprises a fourth switch and a second capacitor,
wherein a first terminal of the first switch is electrically connected to a first terminal of the first capacitor and the image signal line,
wherein a second terminal of the first switch is electrically connected to a first terminal of the second switch, wherein the correction data storage portion is electrically connected to a second terminal of the second switch, a second terminal of the first capacitor, and a first terminal of the third switch, wherein a first terminal of the fourth switch is electrically connected to the image signal line, and wherein the image data storage portion is electrically connected to a second terminal of the fourth switch and the second capacitor.

2. The display device according to claim 1, wherein at least one of the first switch, the second switch, the third switch and the fourth switch is a transistor, and wherein the transistor comprises one of a metal oxide and silicon in a channel formation region.

3. The display device according to claim 1, further comprising:

a first function comprising:

a function of bringing the second switch into an off state, bringing the third switch into an on state, and writing a first potential into the correction data storage portion; and a function of bringing the second switch into an off state, bringing each of the first switch and the fourth switch into an on state, and writing a second potential corresponding to the first image data into the image signal line and the image data storage portion, a second function comprising:

a function of bringing the first switch into an off state, bringing the fourth switch into an on state, and bringing the image signal line and the image data storage portion into an electrically floating state, a third function comprising:

a function of bringing each of the first switch and the third switch into an off state, bringing the second switch into an on state, and writing a third potential corresponding to the correction data into the correction data storage portion; and a function where through a change of a potential at the second terminal of the first capacitor from the first potential to the third potential, the second potential stored in the image signal line and the image data storage portion is changed to a fourth potential corresponding to the second image data, and a fourth function comprising:

a function of bringing the fourth switch into an off state and driving the display element in accordance with the fourth potential.

4. The display device according to claim 3, wherein the second image data includes high-order bits and low-order bits, wherein the second potential is a potential corresponding to the high-order bits, and wherein the third potential is a potential corresponding to the low-order bits in the second image data.

5. The display device according to claim 1, wherein the display element is a liquid crystal element, and wherein a first terminal of the liquid crystal element is electrically connected to the image data storage portion.

6. The display device according to claim 1, further comprising a driver circuit portion, wherein the display element is a light-emitting element, wherein the driver circuit portion comprises a driving transistor, wherein a gate of the driving transistor is electrically connected to the image data storage portion, and wherein a first terminal of the driving transistor is electrically connected to a second terminal of the second capacitor and an input terminal of the light-emitting element.

7. An electronic device comprising:

the display device according to claim 1; and a housing.

* * * * *